(12) United States Patent
Hinrichs

(10) Patent No.: US 11,190,174 B1
(45) Date of Patent: Nov. 30, 2021

(54) DELAY INTERPOLATOR

(71) Applicant: QUALCOMM Incorporated, San Diego, CA (US)

(72) Inventor: Jeffrey Mark Hinrichs, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/240,926

(22) Filed: Apr. 26, 2021

(51) Int. Cl.
*H03K 5/134* (2014.01)
*H03K 5/00* (2006.01)

(52) U.S. Cl.
CPC ... *H03K 5/134* (2014.07); *H03K 2005/00052* (2013.01)

(58) Field of Classification Search
None
See application file for complete search history.

(56) References Cited

U.S. PATENT DOCUMENTS

| | | | |
|---|---|---|---|
| 6,194,937 B1 | 2/2001 | Minami | |
| 6,486,722 B2 | 11/2002 | Yamauchi | |
| 6,650,160 B2 | 11/2003 | Tanahashi | |
| 8,552,783 B2 | 10/2013 | Rylov | |
| 8,917,132 B2 | 12/2014 | Ma et al. | |
| 11,088,682 B2 * | 8/2021 | Lim | H03L 7/0814 |

* cited by examiner

*Primary Examiner* — Cassandra F Cox
(74) *Attorney, Agent, or Firm* — Loza & Loza, LLP

(57) ABSTRACT

A delay interpolator includes pull-up devices, wherein each of the pull-up devices is coupled between a supply rail and a node, and pull-down devices, wherein each of the pull-down devices is coupled between the node and a ground. The delay interpolator also includes a first control circuit coupled to the pull-up devices, wherein the first control circuit has a first input configured to receive a first signal, a second input configured to receive a second signal that is delayed with respect to the first signal, and a control input configured to receive a first delay code; and. The delay interpolator further includes a second control circuit coupled to the pull-down devices, wherein the second control circuit has a first input configured to receive the first signal, a second input configured to receive the second signal, and a control input configured to receive a second delay code.

31 Claims, 14 Drawing Sheets

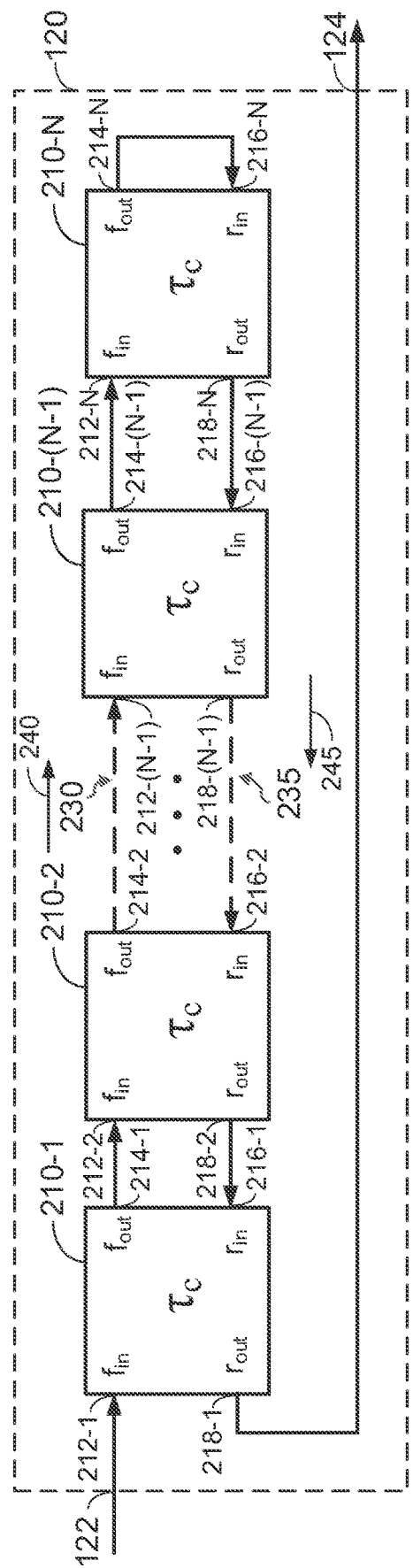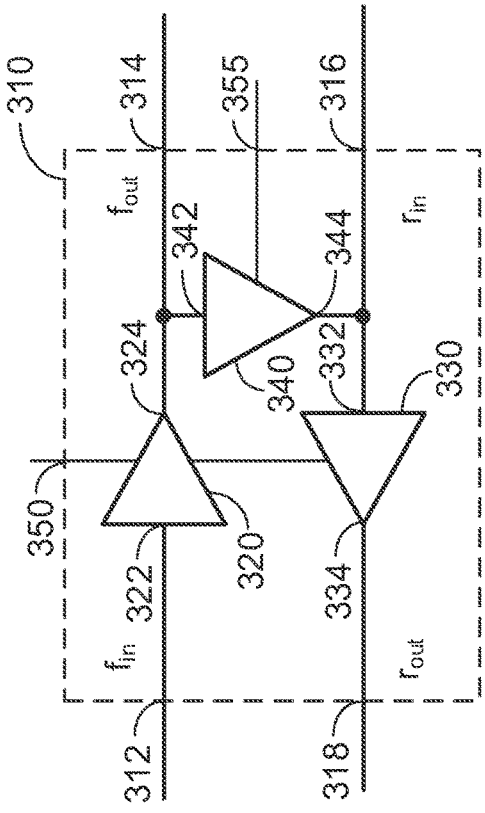
FIG. 2
FIG. 3

DELAY INTERPOLATOR

BACKGROUND

Field

Aspects of the present disclosure relate generally to delay circuits, and, more particularly, to delay interpolators.

Background

A delay circuit may be used to delay a signal by an adjustable (i.e., tunable) delay. The adjustable delay may be used, for example, to adjust the timing of a signal relative to another signal by delaying the signal by a corresponding amount. For example, a delay circuit may be used in a memory interface to center the edges of a clock signal used for data capture between transitions of a data signal.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a delay interpolator. The delay interpolator includes pull-up devices, wherein each of the pull-up devices is coupled between a supply rail and a node, and pull-down devices, wherein each of the pull-down devices is coupled between the node and a ground. The delay interpolator also includes a first control circuit coupled to the pull-up devices, wherein the first control circuit has a first input configured to receive a first signal, a second input configured to receive a second signal that is delayed with respect to the first signal, and a control input configured to receive a first delay code. The delay interpolator further includes a second control circuit coupled to the pull-down devices, wherein the second control circuit has a first input configured to receive the first signal, a second input configured to receive the second signal, and a control input configured to receive a second delay code.

A second aspect relates to a method of operating a delay interpolator. The delay interpolator includes pull-up devices coupled between a supply rail and a node, and pull-down devices coupled between the node and a ground. The method includes receiving a first signal, receiving a second signal that is delayed with respect to the first signal, inputting the first signal to a programmable number of the pull-up devices based on a first delay code, inputting the second signal to remaining ones of the pull-up devices, inputting the first signal to a programmable number of the pull-down devices based on a second delay code, and inputting the second signal to remaining ones of the pull-down devices.

A third aspect relates to a system. The system includes a delay circuit having an input, a first output, and a second output. The system also includes a delay interpolator. The delay interpolator includes pull-up devices, wherein each of the pull-up devices is coupled between a supply rail and a node, and pull-down devices, wherein each of the pull-down devices is coupled between the node and a ground. The delay interpolator also includes a first control circuit coupled to the pull-up devices, wherein the first control circuit has a first input coupled to the first output of the delay circuit, a second input coupled to the second output of the delay circuit, and a control input configured to receive a first delay code. The delay interpolator also includes a second control circuit coupled to the pull-down devices, wherein the second control circuit has a first input coupled to the first output of the delay circuit, a second input coupled to the second output of the delay circuit, and a control input configured to receive a second delay code.

BRIEF DESCRIPTION OF THE DRAWINGS

FIG. 2 shows an exemplary implementation of a coarse delay circuit according to certain aspects of the present disclosure.

FIG. 3 shows an exemplary implementation of a delay device in the coarse delay circuit according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
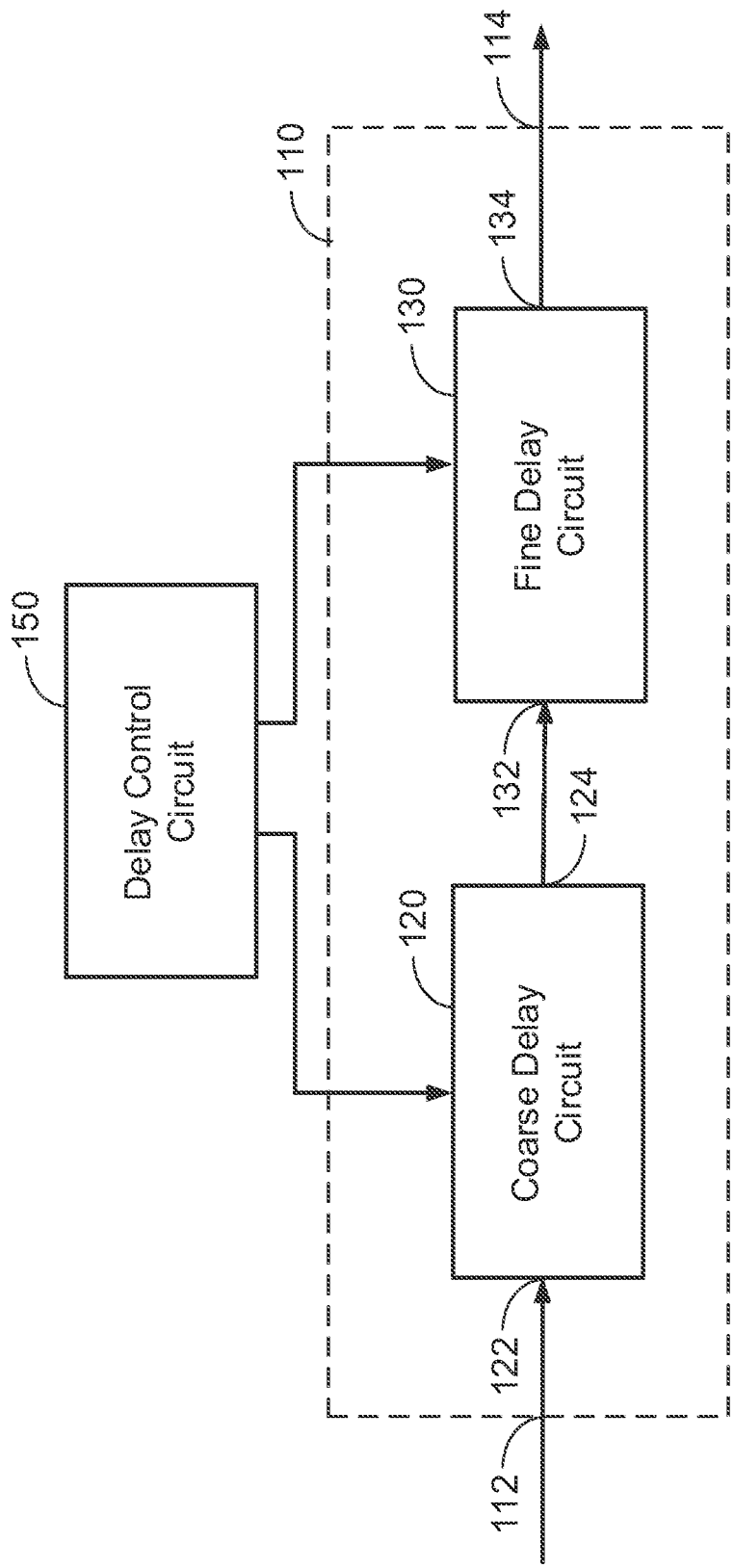
FIG. 1 shows an example of a delay circuit according to certain aspects of the present disclosure.

FIG. 1 shows an example of a delay circuit 110 according to certain aspects of the present disclosure. The delay circuit 110 is configured to receive a signal at an input 112, delay the signal by an adjustable (i.e., tunable) delay, and output the delayed signal at an output 114. The signal may be a clock signal, a data signal, or another type of signal. In this example, the delay of the delay circuit 110 is set by a delay control circuit 150, as discussed further below.

The delay circuit 110 includes a coarse delay circuit 120 and a fine delay circuit 130. The coarse delay circuit 120 has an input 122 coupled to the input 112 of the delay circuit 110, and an output 124. The fine delay circuit 130 has an input 132 coupled to the output 124 of the coarse delay circuit 120, and an output 134 coupled to the output 114 of the delay circuit 110. In this example, the delay of the delay circuit 110 is approximately equal to the sum of the delay of the coarse delay circuit 120 and the delay of the fine delay circuit 130.

The coarse delay circuit 120 is configured to provide coarse adjustments of the delay of the delay circuit 110, and the fine delay circuit 130 is configured to provide fine adjustments of the delay of the delay circuit 110. More particularly, the coarse delay circuit 120 allows the delay control circuit 150 to adjust the delay of the delay circuit 110 in coarse delay steps, and the fine delay circuit 130 allows the delay control circuit 150 to adjust the delay of the delay circuit 110 in fine delay steps between the coarse delay steps. In this example, one fine delay step may be given by:

$$\tau_f = \frac{\tau_c}{R} \quad (1)$$

where $\tau_f$ is a fine delay step, $\tau_c$ is a coarse delay step, and R is the ratio of one coarse delay step to one fine delay step where R is greater than one. In certain aspects, the delay control circuit 150 receives a delay code and adjusts the delay of the delay circuit 110 based on the received delay code by adjusting the delay of the coarse delay circuit 120 and/or the delay of the fine delay circuit 130 accordingly.

In certain aspects, the coarse delay circuit 120 includes multiple delay devices, in which one or more of the delay devices can be selectively placed in a delay path of the coarse delay circuit 120 under the control of the delay control circuit 150 (e.g., using switches, logic gates, and/or one or more multiplexers). The delay path is coupled between the input 122 and the output 124 of the coarse delay circuit 120. In these aspects, the delay control circuit 150 adjusts the delay of the coarse delay circuit 120 by controlling the number of the delay devices in the delay path. The larger the number of the delay devices in the delay path, the longer the delay. In this example, each of the delay devices may have a delay approximately equal to one coarse delay step. Each of the delay devices may also be referred to as a delay stage, a delay unit, or another term.

FIG. 2 shows an exemplary implementation of the coarse delay circuit 120 according to certain aspects of the present disclosure. In this example, the coarse delay circuit 120 includes multiple delay devices 210-1 to 210-N arranged in a trombone configuration. Each of the delay devices 210-1 to 210-N has a respective first input 212-1 to 212-N (labeled "$f_{in}$"), a respective first output 214-1 to 214-N (labeled "$f_{out}$"), a respective second input 216-1 to 216-N (labeled "$r_{in}$"), and a respective second output 218-1 to 218-N (labeled "$r_{out}$").

In this example, the delay devices 210-1 to 210-N are coupled along a forward path 230 using the first inputs 212-1 to 212-N and the first outputs 214-1 to 214-N of the delay devices 210-1 to 210-N. The signal being delayed is received at the input 122 of the coarse delay circuit 120 and propagates along the forward path 230 in the direction 240 (i.e., left to right in FIG. 2). In this example, the first input 212-1 of delay device 210-1 is coupled to the input 122 of the coarse delay circuit 120. The first output 214-1 to 214-(N−1) of each of delay devices 210-1 to 210-(N−1) is coupled to the first input 212-2 to 212-N of the next delay device 210-2 to 210-N in the forward direction 240, as shown in FIG. 2. In this example, the first output 214-N of delay device 210-N may be coupled to the second input 216-N of delay device 210-N.

The delay devices 210-1 to 210-N are also coupled along a return path 235 using the second inputs 216-1 to 216-N and the second outputs 218-1 to 218-N of the delay devices 210-1 to 210-N. The signal being delayed propagates along the return path 235 in the direction 245 (i.e., right to left in FIG. 2), and is output at the output 124 of the coarse delay circuit 120. In this example, the second output 218-2 to 218-N of each of delay devices 210-2 to 210-N is coupled to the second input 216-1 to 216-(N−1) of the next delay device 210-1 to 210-(N−1) in the return direction 245, as shown in FIG. 2. The second output 218-1 of delay device 210-1 is coupled to the output 124 of the coarse delay circuit 120.

In this example, each of the delay devices 210-1 to 210-N may be selectively enabled or disabled by the delay control circuit 150. When enabled, a delay device may be configured by the delay control circuit 150 to operate in a first mode or a second mode. In the first mode, a delay device passes the signal being delayed from the respective first input 212-1 to 212-N to the respective first output 214-1 to 214-N in the forward direction 240 and passes the signal being delayed from the respective second input 216-1 to 216-N to the respective second output 218-1 to 218-N in the return direction 245. In the second mode, a delay device passes the signal being delayed from the respective first input 212-1 to 212-N to the respective second output 218-1 to 218-N. Thus, in the second mode, a delay device routes the signal from the forward path 230 to the return path 235. In this case, the signal does not propagate through delay devices located after the delay device operating in the second mode in the forward direction 240 (i.e., delay devices located to the right of the delay device operating in the second mode in FIG. 2).

In this example, the delay control circuit 150 controls the delay of the coarse delay circuit 120 by controlling which one of the delay devices 210-1 to 210-N is used to route the signal from the forward path 230 to the return path 235 (i.e., controlling which one of the delay devices 210-1 to 210-N operates in the second mode). In this example, the delay control circuit 150 increases the delay of the coarse delay circuit 120 by selecting a delay device farther down the forward path 230 to route the signal from the forward path 230 to the return path 235. This increases the delay of the coarse delay circuit 120 by causing the signal to propagate through a larger number of the delay devices 210-1 to 210-N. In this example, the delay control circuit 150 operates the delay device used to route the signal from the forward path 230 to the return path 235 in the second mode, and operates the preceding delay devices in the first mode (i.e., the delay devices located to the left of the delay device operating in the second mode in FIG. 2). In this example, one coarse delay step may be equal to the sum of the delay through one delay device in the forward direction 240 and the delay through one delay device in the return direction 245.

Note that the individual connections between the delay control circuit 150 and the delay devices 210-1 to 210-N are not explicitly shown in FIG. 2.

FIG. 3 shows an exemplary implementation of a delay device 310 that may be used in a trombone configuration according to certain aspects. The delay device 310 may be used to implement each of the delay devices 210-1 to 210-N shown in FIG. 2 (e.g., each of the delay devices 210-1 to 210-N may be a separate instance of the delay device 310 in FIG. 3). In this example, the delay device 310 has a first input 312, a first output 314, a second input 316, and a second output 318. The delay device 310 includes a first delay buffer 320, a second delay buffer 330, and a third delay buffer 340. The first delay buffer 320 has an input 322 coupled to the first input 312, and an output 324 coupled to the first output 314. The second delay buffer 330 has an input 332 coupled to the second input 316, and an output 334 coupled to the second output 318. The third delay buffer 340 has an input 342 coupled to the output 324 of the first delay buffer 320, and an output 344 coupled to the input 332 of the second delay buffer 330.

In this example, the delay control circuit 150 selectively enables or disables the first delay buffer 320 and the second delay buffer 330 via control line 350, and selectively enables or disables the third delay buffer 340 via control line 355. In this example, each of the delay buffers 320, 330 and 340 may be configured to delay the signal by a respective delay when enabled by the delay control circuit 150, and block the signal when disabled by the delay control circuit 150. Each of the delay buffers 320, 330 and 340 may be implemented with a tri-state inverter, a NAND gate, or another type of delay buffer.

In this example, the delay control circuit 150 may disable the delay device 310 by disabling the delay buffers 320, 330 and 340. The delay control circuit 150 may operate the delay device 310 in the first mode by enabling the first delay buffer 320 and the second delay buffer 330, and disabling the third delay buffer 340. In the first mode, the first delay buffer 320 delays the signal received at the first input 312 on the forward path 230 and outputs the delayed signal at the first output 314. The second delay buffer 330 delays the signal received at the second input 316 on the return path 235 and outputs the delayed signal at the second output 318. Thus, in the first mode, the first delay buffer 320 delays the signal on the forward path 230 and the second delay buffer 330 delays the signal on the return path 235.

The delay control circuit 150 may operate the delay device 310 in the second mode by enabling the first delay buffer 320, the second delay buffer 330, and the third delay buffer 340. In the second mode, the third delay buffer 340 passes the signal at the output 324 of the first delay buffer 320 on the forward path 230 to the input 332 of the second delay buffer 330 on the return path 235. Thus, in the second mode, the delay device 310 routes the signal from the forward path 230 to the return path 235 through the third delay buffer 340.

Figure 4:
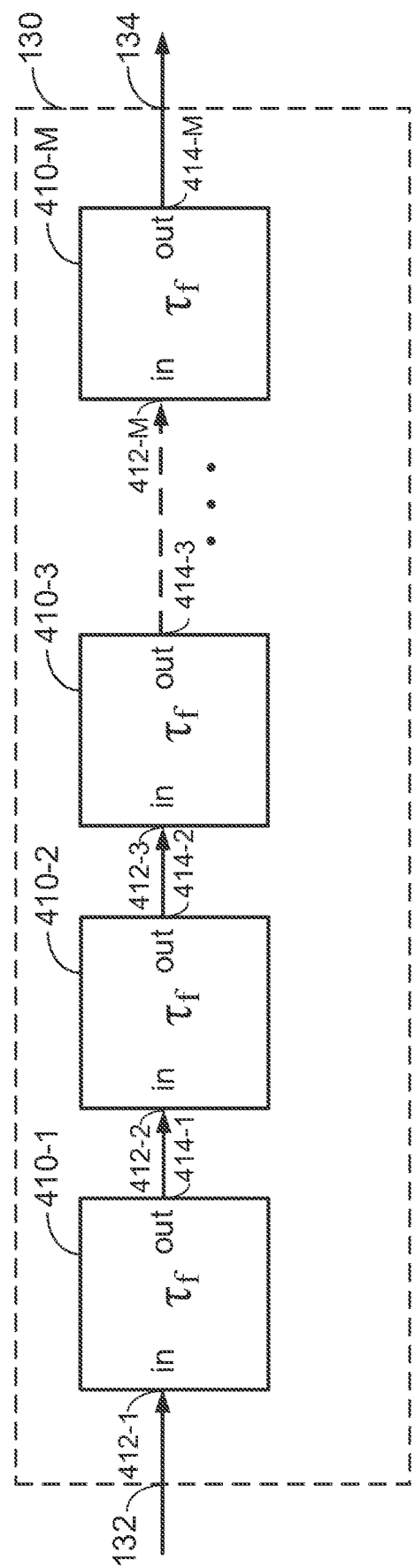
FIG. 4 shows an exemplary implementation of a fine delay circuit according to certain aspects of the present disclosure.

FIG. 4 shows an exemplary implementation of the fine delay circuit 130 according to aspects of the present disclosure. In this example, the fine delay circuit 130 includes multiple delay devices 410-1 to 410-M coupled in series to form a delay line (i.e., delay chain). As a result, the delay of the fine delay circuit 130 is approximately equal to the sum of the delays of the delay devices 410-1 to 410-M.

Each of the delay devices 410-1 to 410-M has a respective input 412-1 to 412-M (labeled "in"), and a respective output 414-1 to 414-M (labeled "out"). The input 412-1 of delay device 410-1 is coupled to the input 132 of the fine delay circuit 130, and the output 414-M of delay device 410-M is coupled to the output 134 of the fine delay circuit 130. The output 414-1 to 414-(N−1) of each of delay devices 410-1 to 410-(N−1) is coupled to the input 412-2 to 412-N of the next delay device 410-2 to 410-N in the delay line.

In certain aspects, the delay control circuit 150 controls the delay of the fine delay circuit 130 by adjusting the delay of each of the delay devices 410-1 to 410-M. For example, each of the delay devices 410-1 to 410-M may include a variable capacitive load, in which the delay control circuit 150 adjusts the delay of each delay device 410-1 to 410-M by adjusting the respective capacitive load. In this example, the larger the capacitive load of a delay device, the longer the delay of the delay device.

Figure 5:
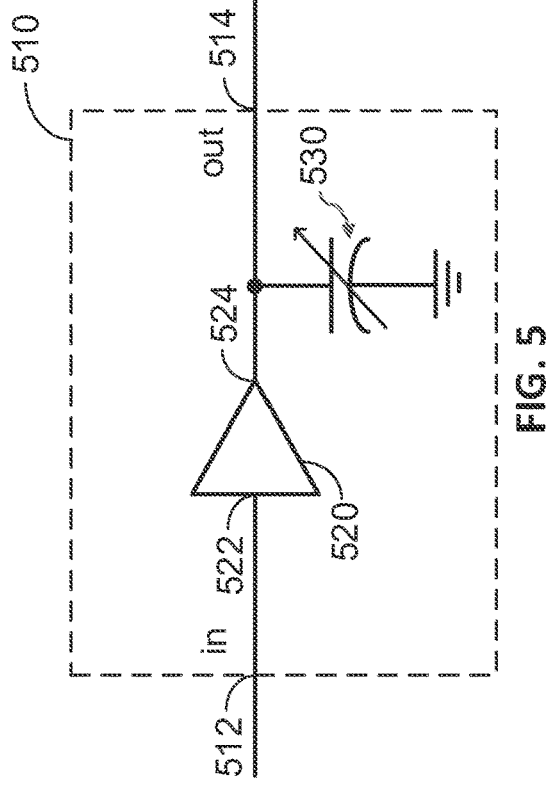
FIG. 5 shows an exemplary implementation of a delay device in the fine delay circuit according to certain aspects of the present disclosure.

FIG. 5 shows an exemplary implementation of a delay device 510 that may be used in the fine delay circuit 130 according to certain aspects. The delay device 510 may be used to implement each of the delay devices 410-1 to 410-M shown in FIG. 4 (e.g., each of the delay devices 410-1 to 410-M may be a separate instance of the delay device 510 in FIG. 5). In this example, the delay device 510 has an input 512 and an output 514. The delay device 510 includes a delay buffer 520 and a variable capacitor 530. The delay buffer 520 has an input 522 coupled to the input 512 of the delay device 510 and an output 524 coupled to the output 514 of the delay device 510. The delay buffer 520 may be implemented with an inverter or another type of delay buffer.

The variable capacitor 530 is coupled to the output 524 of the buffer 520. In this example, the variable capacitor 530 has an adjustable (i.e., tunable) capacitance that is controlled by the delay control circuit 150. This allows the delay control circuit 150 to adjust the capacitive load at the output 524 of the delay buffer 520 (and hence the delay of the delay device 510) by adjusting the capacitance of the variable capacitor 530. The larger the capacitance of the capacitor 530, the larger the capacitive load, and hence the longer the delay of the delay device 510.

In this example, the coarse delay and the fine delay are adjusted using different circuit delaying techniques. The delay control circuit 150 adjusts the delay of the coarse delay circuit 120 by adjusting the number of the delay devices 210-1 to 210-N in the delay path of the coarse delay circuit 120, and adjusts the delay of the fine delay circuit 130 by adjusting the capacitive loads of the delay devices 410-1 to 410-M. Because different circuit delaying techniques are used for coarse delay adjustments and fine delay adjustments, there is no correlation between changes in one coarse delay step and changes in one fine delay step due to process voltage temperature (PVT) variations. As a result, the ratio of one coarse delay step to one fine delay step may not be well controlled, which can lead to conversion error when switching from fine delay to coarse delay.

Figure 6:
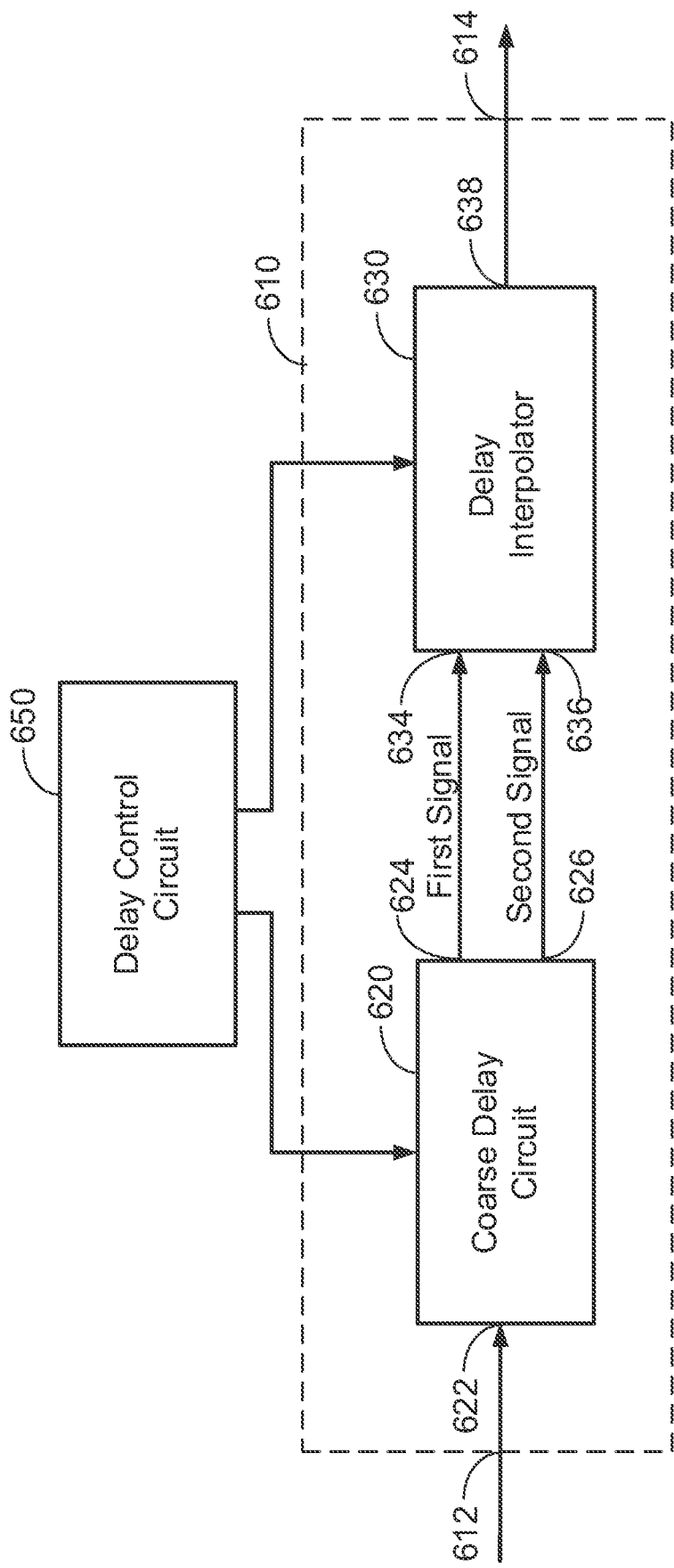
FIG. 6 shows an example of a delay circuit including a delay interpolator according to certain aspects of the present disclosure.

FIG. 6 shows an exemplary delay circuit 610 according to certain aspects of the present disclosure. The delay circuit 610 is configured to receive a signal at an input 612, delay the signal by an adjustable (i.e., tunable) delay, and output the delayed signal at an output 614. The signal may be a clock signal, a data signal, or another type of signal. In this example, the delay of the delay circuit 610 is set by a delay control circuit 650, as discussed further below.

The delay circuit 610 includes a coarse delay circuit 620 and a delay interpolator 630. The coarse delay circuit 620 has an input 622 coupled to the input 612 of the delay circuit 610, a first output 624, and a second output 626. The delay interpolator 630 has a first input 634 coupled to the first output 624 of the coarse delay circuit 620, a second input 636 coupled to the second output 626 of the coarse delay circuit 620, and an output 638 coupled to the output 614 of the delay circuit 610.

The coarse delay circuit 620 is configured to provide coarse adjustments of the delay of the delay circuit 610, and the delay interpolator 630 is configured to provide fine adjustments of the delay of the delay circuit 610. More particularly, the coarse delay circuit 620 allows the delay control circuit 650 to adjust (i.e., tune) the delay of the delay circuit 610 in coarse delay steps, and the delay interpolator 630 allows the delay control circuit 650 to adjust the delay of the delay circuit 610 in fine delay steps between the coarse delay steps. The relationship between one coarse delay step and one fine delay step may be defined by equation (1) discussed above.

In the example in FIG. 6, the coarse delay circuit 620 is configured to receive the signal being delayed at the input 622. The coarse delay circuit 620 is configured to delay the received signal by an adjustable (i.e., tunable) delay under the control of the delay control circuit 650 to provide a first signal. The coarse delay circuit 620 is also configured to delay the received signal by the adjustable (i.e., tunable) delay and an additional delay to provide a second signal, in which the second signal is delayed with respect to the first signal by the additional delay. The coarse delay circuit 620 is configured to output the first signal at the first output 624 and output the second signal at the second output 626. Thus, each of the first signal and the second signal is a delayed version of the received signal, in which the second signal is delayed with respect to the first signal by the additional delay. The first signal may also be referred to as an "early" signal since the first signal is early with respect to the second signal by the additional delay, and the second signal may also be referred to as a "late" signal since the second signal is delayed with respect to the first signal by the additional delay. The received signal may also be referred to as an input signal since the received signal is input to the coarse delay circuit 620.

In certain aspects, the coarse delay circuit 620 is configured to delay the second signal with respect to the first signal by one coarse delay step. In one example, the delay control circuit 650 may adjust (i.e., tune) the adjustable (i.e., tunable) delay of the first signal by controlling the number of delay devices in the delay path between the input 622 and the first output 624 of the coarse delay circuit 620 (e.g., using a delay control signal that controls switches, logic gates, and/or one or more multiplexers in the coarse delay circuit 620). In this example, the coarse delay circuit 620 receives the delay control signal from the delay control circuit 650 and adjusts (i.e., tunes) the adjustable (i.e., tunable) delay by a multiple of one coarse delay step based on the delay control signal. The multiple may be an integer that is equal to or greater than one. In this example, the coarse delay circuit 620 may provide the second signal by delaying the first signal with an additional delay device having a delay of one coarse delay step. Thus, in this example, the delay of the second signal tracks changes in the delay of the first signal while maintaining a delay of one coarse delay step between the second signal and the first signal.

The delay interpolator 630 is configured to receive the first signal at the first input 634 and receive the second signal at the second input 636. The interpolator 630 is configured to interpolate between the first signal and the second signal to produce a delay that is a fraction of the delay between the first signal and the second signal. For the example in which the delay between the first signal and the second signal is equal to one coarse delay step, the interpolator 630 produces a delay that is a fraction of one coarse delay step. In certain aspects, the delay control circuit 650 controls the fine delay of the delay circuit 610 by controlling the interpolation of the delay interpolator 630 (e.g., using a digital delay code).

The delay interpolator 630 allows the ratio of one coarse delay step to one fine delay step to be more precisely controlled compared with the delay circuit 110 in FIG. 1. This is because the interpolation between the first signal and the second signal by the delay interpolator 630 tracks changes in the delay between the first signal and the second signal (e.g., one coarse delay step) caused by changes in the coarse delay circuit 620 due to PVT variations. As a result, the fine delay provided by the interpolation tracks changes in the delay between the first signal and the second signal (e.g., one coarse delay step) caused by changes in the coarse delay circuit 620 due to PVT variations, resulting in more precise control of the ratio of one coarse delay step to one fine delay step across PVT variations.

Figure 7:
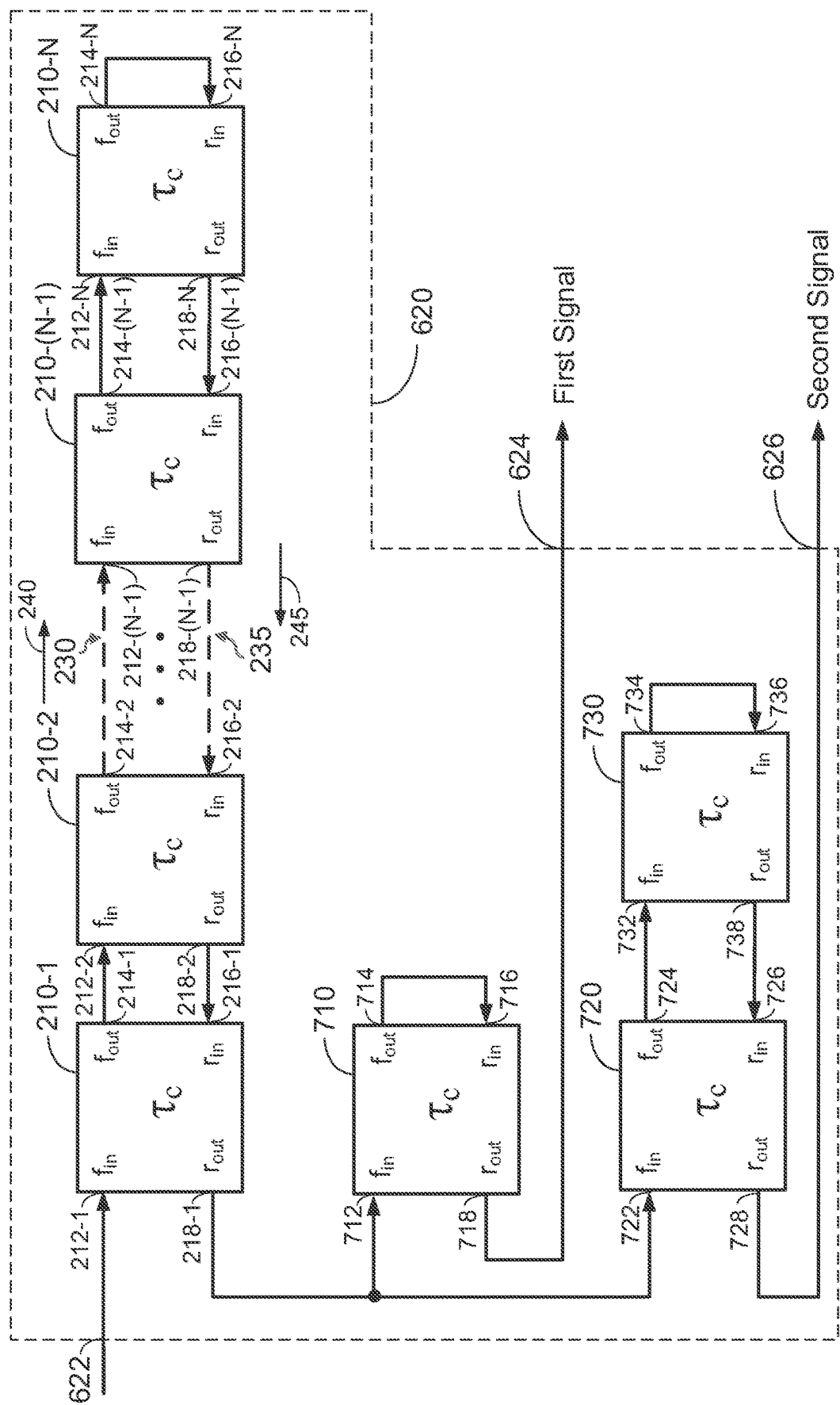
FIG. 7 shows an exemplary implementation of a coarse delay circuit configured to output two delayed signals according to certain aspects of the present disclosure.

FIG. 7 shows an exemplary implementation of the coarse delay circuit 620 according to certain aspects. In this example, the coarse delay circuit 620 includes the delay devices 210-1 to 210-N coupled in the trombone configuration. The first input 212-1 of delay device 210-1 is coupled to the input 612 of the coarse delay circuit 620. The delay control circuit 650 controls the delay at the second output 218-1 of delay device 210-1 by selecting the delay device in the trombone configuration that is used to route the signal from the forward path 230 to the return path 235, as discussed above with reference to FIG. 2. In this example, the delay control circuit 650 adjusts (i.e., tunes) the delays of the first signal and the second signal by selecting the delay device in the trombone configuration that is used to route the signal from the forward path 230 to the return path 235.

In this example, the coarse delay circuit 620 also includes a first delay device 710, a second delay device 720, and a third delay device 730. Each of the delay devices 710, 720, and 730 may be structurally the same or similar to a delay device in the trombone configuration (e.g., implemented with the exemplary delay device 310 shown in FIG. 3). In this example, each of the delay devices 710, 720, and 730 may be configured to operate in the first mode.

In this example, the first input 712 of the first delay device 710 is coupled to the second output 218-1 of delay device 210-1, the first output 714 of the first delay device 710 is coupled to the second input 716 of the first delay device 710, and the second output 718 of the first delay device 710 is coupled to the first output 624 of the coarse delay circuit 620. The first delay device 710 receives the signal from the second output 218-1 of delay device 210-1 and delays the signal by one coarse delay step to provide the first signal at the first output 624 of the coarse delay circuit 620.

In this example, the first input 722 of the second delay device 720 is coupled to the second output 218-1 of delay device 210-1, the first output 724 of the second delay device 720 is coupled to the first input 732 of the third delay device 730, the first output 734 of the third delay device 730 is coupled to the second input 736 of the third delay device 730, the second output 738 of the third delay device 730 is coupled to the second input 726 of the second delay device 720, and the second output 728 of the second delay device 720 is coupled to the second output 626 of the coarse delay circuit 620. The second delay device 720 receives the signal from the second output 218-1 of delay device 210-1. The second delay device 720 and the third delay device 730 delay the signal by two coarse delay steps to provide the second signal at the second output 626 of the coarse delay circuit 620.

Thus, in this example, the first signal is provided by delaying the signal from the second output 218-1 of delay device 210-1 by one coarse delay step using the first delay device 710, and the second signal is provided by delaying the signal from the second output 218-1 of delay device 210-1 by two coarse delay steps using the second delay device 720 and the third delay device 730. As a result, the delay between the first signal and the second signal is one coarse delay step in this example.

It is to be appreciated that the coarse delay circuit 620 is not limited to a tunable delay circuit with a trombone configuration. For example, the coarse delay circuit 620 may be implemented with another type of tunable delay circuit in which the second signal may be provided by delaying the first signal by one or more additional delay devices. Another exemplary implementation of the coarse delay circuit 620 is discussed below with reference to FIG. 14.

Figure 8:
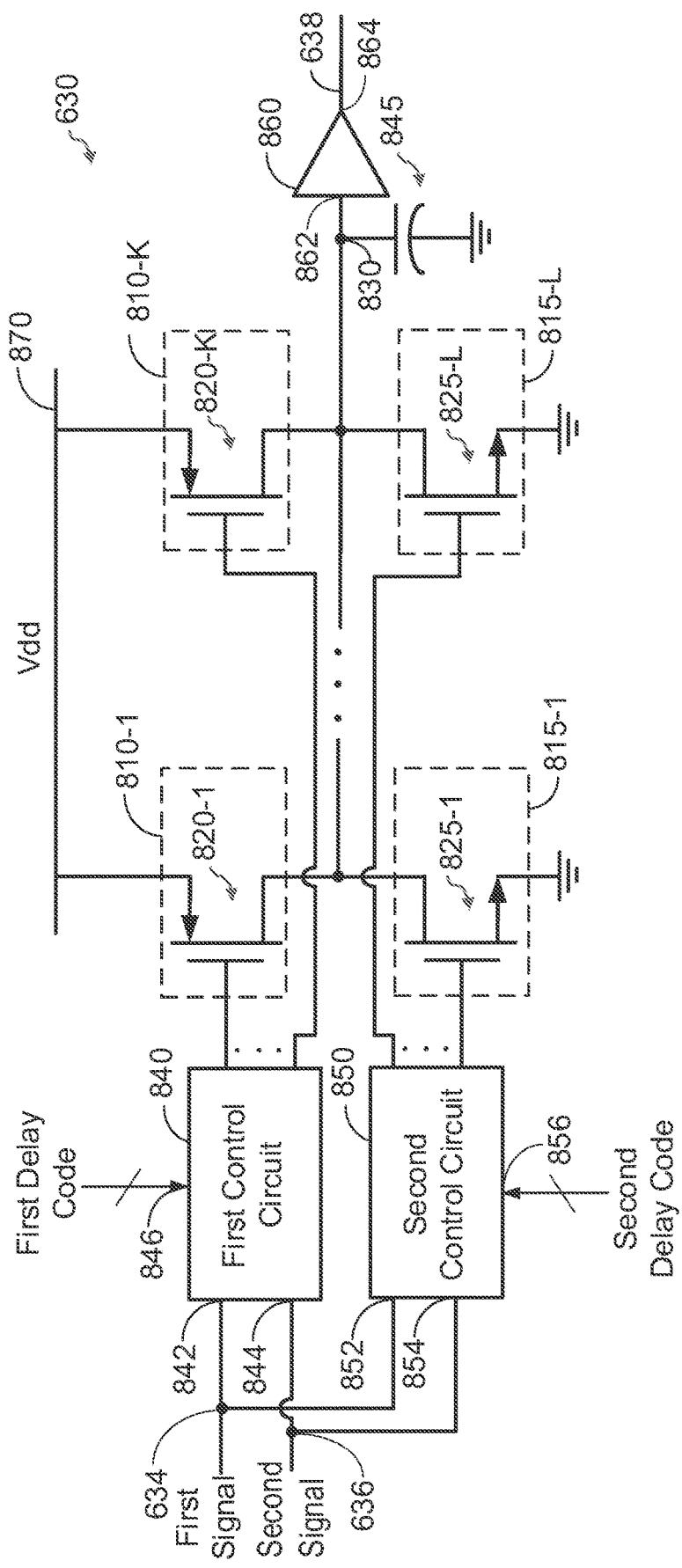
FIG. 8 shows an exemplary implementation of a delay interpolator according to certain aspects of the present disclosure.

FIG. 8 shows an exemplary implementation of the delay interpolator 630 according to certain aspects of the present disclosure. The delay interpolator 630 includes multiple pull-up devices 810-1 to 810-K, multiple pull-down devices 815-1 to 815-L, a capacitor 845, and an output buffer 860.

Each of the pull-up devices 810-1 to 810-K is coupled between a node 830 and a voltage supply rail 870, in which the voltage supply rail 870 provides a supply voltage Vdd. As discussed further below, each of the pull-up devices 810-1 to 810-K is configured to pull the node 830 high (e.g., pull the node 830 up to Vdd) when the pull-up device is turned on. In the example in FIG. 8, each of the pull-up devices 810-1 to 810-K includes a respective transistor 820-1 to 820-K (e.g., respective p-type field effect transistor (PFET)). For the example is which each of the transistors 820-1 to 820-K is implemented with a PFET, each of the pull-up devices 810-1 to 810-K is turned on when the gate of the respective transistor 820-1 to 820-K is driven low (e.g., approximately ground). In this example, the source of each of the transistors 820-1 to 820-K is coupled to the supply rail 870 and the drain of each of the transistors 820-1 to 820-K is coupled to the node 830.

Each of the pull-down devices 815-1 to 815-L is coupled between the node 830 and ground. As discussed further below, each of the pull-down devices 815-1 to 815-L is configured to pull the node 830 low (e.g., pull the node 830 to ground) when the pull-down device is turned on. In the example in FIG. 8, each of the pull-down devices 815-1 to 815-L includes a respective transistor 825-1 to 825-L (e.g., respective n-type field effect transistor (NFET)). For the example in which each of the transistors 825-1 to 825-L is implemented with an NFET, each of the pull-down devices 815-1 to 815-L is turned on when the gate of the respective transistor 825-1 to 825-L is driven high (e.g., Vdd). In this example, the drain of each of the transistors 825-1 to 825-L is coupled to the node 830, and the source of each of the transistors 825-1 to 825-L is coupled to ground. The number of pull-down devices 815-1 to 815-L and the number of pull-up devices 810-1 to 810-K may be the same or different.

The capacitor 845 is coupled between the node 830 and ground. The output buffer 860 has an input 862 coupled to the node 830, and an output 864 coupled to the output 638 of the delay interpolator 630. Thus, in this example, the output 864 of the output buffer 860 provides the delayed signal at the output 638 of the delay interpolator 630. In the discussion below, the output buffer 860 is assumed to be non-inverting. However, it is to be appreciated that this need not be the case.

The delay interpolator 630 also includes a first control circuit 840 and a second control circuit 850. The first control circuit 840 has a first input 842 coupled to the first input 634 of the delay interpolator 630, and a second input 844 coupled to the second input 636 of the delay interpolator 630. Thus, the first input 842 receives the first signal and the second input 844 receives the second signal. The first control circuit 840 also has a control input 846 configured to receive a first delay code from the delay control circuit 650. The first control circuit 840 is also coupled to the pull-up devices 810-1 to 810-K. For the example in which each of the pull-up devices 810-1 to 810-K includes a respective transistor 820-1 to 820-K, the first control circuit 840 is coupled to the gate of each of the transistors 820-1 to 820-K.

In one example, the first control circuit 840 uses the pull-up devices 810-1 to 810-K to control the fine delay of a rising edge at the output 638 of the delay interpolator 630 based on the first delay code. In this example, the first control circuit 840 is configured to input the first signal received at the first input 842 to a programmable number n of the pull-up devices 810-1 to 810-K based on the first delay code, and input the second signal received at the second input 844 to the remaining ones of the pull-up devices 810-1 to 810-K (i.e., K-n of the pull-up devices 810-1 to 810-K where K is the total number of pull-up devices 810-1 to 810-K). In this example, delay interpolation is achieved by controlling the number n of the pull-up devices 810-1 to 810-K driven by the first signal and the number (i.e., K-n) of the pull-up devices 810-1 to 810-K driven by the second signal. The delay interpolation allows the first control circuit 840 to decrease the fine delay of the rising edge by increasing the number n of the pull-up devices 810-1 to 810-K driven by the first signal (i.e., inputting the first signal to a larger number n of the pull-up-devices 810-1 to 810-K), and increase the fine delay of the rising edge by decreasing the number n of the pull-up devices 810-1 to 810-K driven by the first signal (i.e., inputting the first signal to a smaller number n of the pull-up devices 810-1 to 810-K). In this example, the programmable number n is the number of the pull-up devices 810-1 to 810-K to which the first control circuit 840 inputs the first signal based on the first delay code.

The second control circuit 850 has a first input 852 coupled to the first input 634 of the delay interpolator 630, a second input 854 coupled to the second input 636 of the delay interpolator 630. Thus, the first input 852 receives the first signal and the second input 854 receives the second signal. The second control circuit 850 also has a control input 856 configured to receive a second delay code from the delay control circuit 650. The second control circuit 850 is also coupled to the pull-down devices 815-1 to 815-L. For the example in which each of the pull-down devices 815-1 to 815-L includes a respective transistor 825-1 to 825-L, the second control circuit 850 is coupled to the gate of each of the transistors 825-1 to 825-L.

In one example, the second control circuit 850 uses the pull-down devices 815-1 to 815-L to control the fine delay of a falling edge at the output 638 of the delay interpolator 630 based on the second delay code. In this example, the second control circuit 850 is configured to input the first signal received at the first input 852 to a programmable number m of the pull-down devices 815-1 to 815-L based on the second delay code, and input the second signal received at the second input 854 to the remaining ones of the pull-down devices 815-1 to 815-L (i.e., L-m of the pull-down devices 815-1 to 815-L where L is the total number of pull-down devices 815-1 to 815-L). In this example, delay interpolation is achieved by controlling the number m of the pull-down devices 815-1 to 815-L driven by the first signal and the number (i.e., L-m) of the pull-down devices 815-1 to 815-L driven by the second signal. The delay interpolation allows the second control circuit 850 to decrease the fine delay of the falling edge by increasing the number m of the pull-down devices 815-1 to 815-L driven by the first signal (i.e., inputting the first signal to a larger number m of the pull-down devices 815-1 to 815-L), and increase the fine delay of the falling edge by decreasing the number m of the pull-down devices 815-1 to 815-L driven by the first signal (i.e., inputting the first signal to a smaller number m of the pull-down devices 815-1 to 815-L). In this example, the programmable number m is the number of the pull-down devices 815-1 to 815-L to which the second control circuit 850 inputs first signal based on the second delay code.

In this example, the first control circuit 840 controls the input of the first signal and the second signal to the pull-up devices 810-1 to 810-K based on the first delay code, and the second control circuit 850 controls the input of the first signal and the second signal to the pull-down devices 815-1 to 815-L based on the second delay code. Thus, the first control circuit 840 and the second control circuit 850 allow the fine delay of a rising edge at the output 638 and the fine delay of a falling edge at the output 638 to be adjusted independently by using different codes for the first delay code and the second delay code. This feature can be used to adjust the duty cycle of the delayed signal at the output 638, as discussed further below. For applications where duty cycle adjustment is not needed, the same code may be used for the first delay code and the second delay code (i.e., the first delay code and the second delay code may be the same).

In this example, the first signal and the second signal are input to the pull-up devices 810-1 to 810-K through control paths in the first control circuit 840. The control paths may include logic gates that control the input of the first signal and the second signal to the pull-up devices 810-1 to 810-K based on the first delay code. An exemplary implementation of control paths in the first control circuit 840 are discussed below with reference to FIG. 10. The control paths may be non-inverting or inverting (i.e., invert the first signal and/or the second signal before input to the pull-up devices 810-1 to 810-K).

Also, in this example, the first signal and the second signal are input to the pull-down devices 815-1 to 815-L through control paths in the second control circuit 850. The control paths may include logic gates that control the input of the first signal and the second signal to the pull-down devices 815-1 to 815-L based on the second delay code. An exemplary implementation of the control paths in the second control circuit 850 are discussed below with reference to FIG. 10. The control paths may be non-inverting or inverting (i.e., invert the first signal and/or the second signal before input to the pull-down devices 815-1 to 815-L).

Thus, the first control circuit 840 and the second control circuit 850 provide separate control paths for the pull-up devices 810-1 to 810-K and the pull-down devices 815-1 to 815-L. The separate control paths help prevent glitching at the output 638 of the delay interpolator 630 on changes in the first delay code and/or the second delay code.

Figure 9:
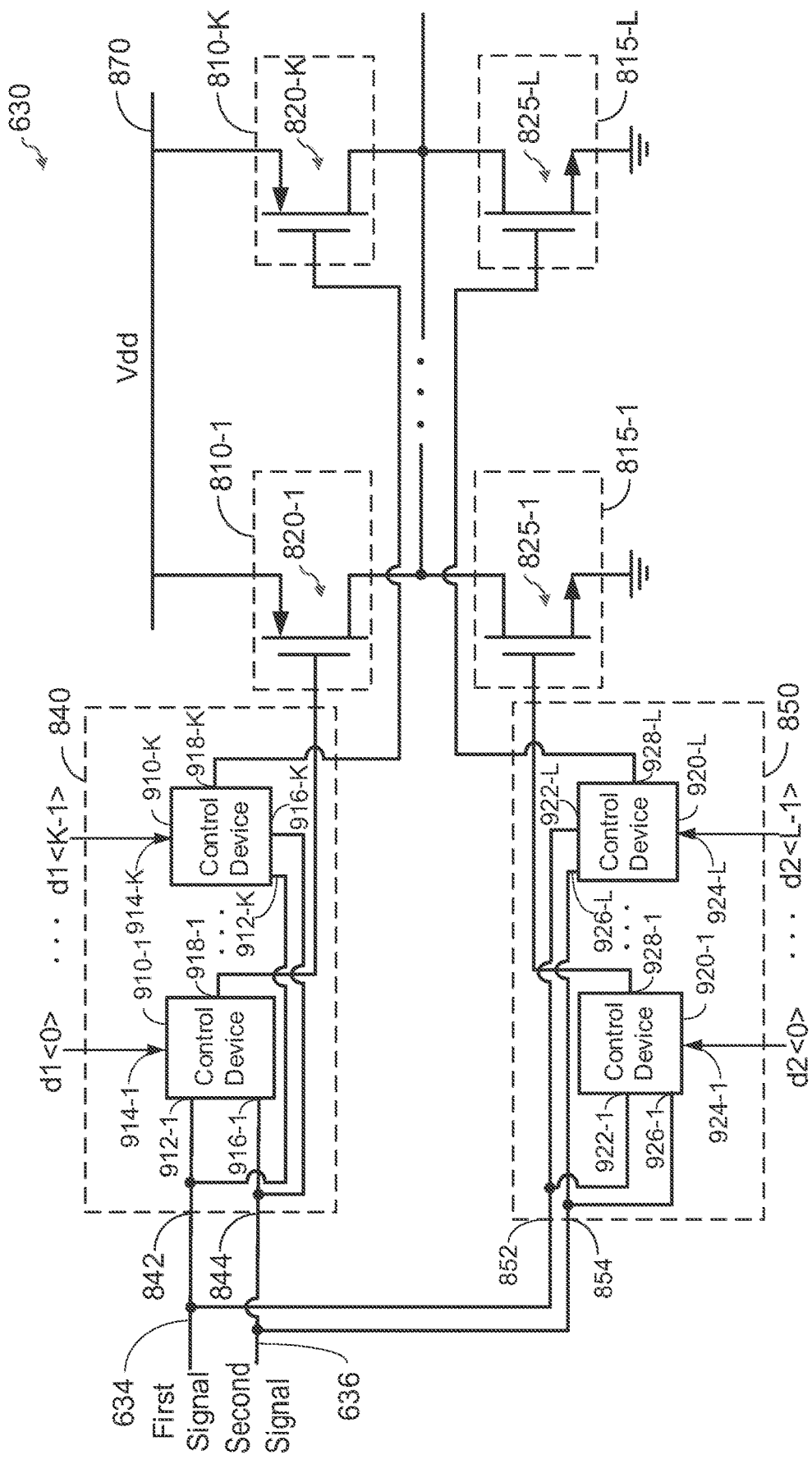
FIG. 9 shows an exemplary implementation of a first control circuit and a second control circuit according to certain aspects of the present disclosure.

FIG. 9 shows an exemplary implementation of the first control circuit 840 according to certain aspects. In this example, the first control circuit 840 includes multiple control devices 910-1 to 910-K, in which each of the control devices 910-1 to 910-K is configured to control the input of the first signal and the second signal to a respective one of the pull-up devices 810-1 to 810-K.

In this example, each of the control devices 910-1 to 910-K has a respective first input 912-1 to 912-K coupled to the first input 842 of the first control circuit 840 to receive the first signal, and a respective second input 916-1 to 916-K coupled to the second input 844 of the first control circuit 840 to receive the second signal. Each of the control devices 910-1 to 910-K also has a respective control input 914-1 to 914-K, and a respective output 918-1 to 918-K coupled to the respective one of the pull-up devices 810-1 to 810-K (e.g., the gate of the respective transistor 820-1 to 820-K). In this example, the first delay code may be a thermometer code d1<K-1:0> including multiple bits where each bit is used to control the input of a respective one of the pull-up devices 810-1 to 810-K. In this example, the control input 914-1 to 914-K of each of the control devices 910-1 to 910-K is configured to receive a respective one of the bits of the thermometer code d1<K-1:0>. For example, the control input 914-1 of control device 910-1 receives bit d1<0> of the thermometer code d1<K-1:0>.

In operation, each of the control devices 910-1 to 910-K is configured to input the first signal or the second signal to the respective pull-up device 810-1 to 810-K based on a logic value of the respective bit of the thermometer code d1<K-1:0>. For example, each of the control devices 910-1 to 910-K may be configured to input the first signal to the respective pull-up device when the respective bit has a first logic value and input the second signal to the respective pull-up device when the respective bit has a second logic value. For example, the first logic value may be one and the second logic value may be zero, or vice versa. In this example, the first control circuit 840 sets the minimum delay when all of the bits of the thermometer code d1<K-1:0> have the first logic value (i.e., the first signal is input to all of the pull-up devices 810-1 to 810-K).

FIG. 9 also shows an exemplary implementation of the second control circuit 850 according to certain aspects. In this example, the second control circuit 850 includes multiple control devices 920-1 to 920-L, in which each of the control devices 920-1 to 920-L is configured to control the input of the first signal and the second signal to a respective one of the pull-down devices 815-1 to 815-L.

In this example, each of the control devices 920-1 to 920-L has a respective first input 922-1 to 922-L coupled to the first input 852 of the second control circuit 850 to receive the first signal, and a respective second input 926-1 to 926-L coupled to the second input 854 of the second control circuit 850 to receive the second signal. Each of the control devices 920-1 to 920-L also has a respective control input 924-1 to 924-L, and a respective output 928-1 to 928-L coupled to the respective one of the pull-down devices 815-1 to 815-L (e.g., the gate of the respective transistor 825-1 to 825-L). In this example, the second delay code may be a thermometer code d2<L-1:0> including multiple bits where each bit is used to control the input of a respective one of the pull-down devices 815-1 to 815-L. In this example, the control input 924-1 to 924-L of each of the control devices 920-1 to 920-L is configured to receive a respective one of the bits of the thermometer code d2<L-1:0>. For example, the control input 924-1 of control device 920-1 receives bit d2<0> of the thermometer code d2<L-1:0>.

In operation, each of the control devices 920-1 to 920-L is configured to input the first signal or the second signal to the respective pull-down device 815-1 to 815-L based on a logic value of the respective bit of the thermometer code d2<L−1:0>. For example, each of the control devices 920-1 to 920-L may be configured to input the first signal to the respective pull-down device when the respective bit has the first logic value and input the second signal to the respective pull-down device when the respective bit has the second logic value, or vice versa.

Figure 10:
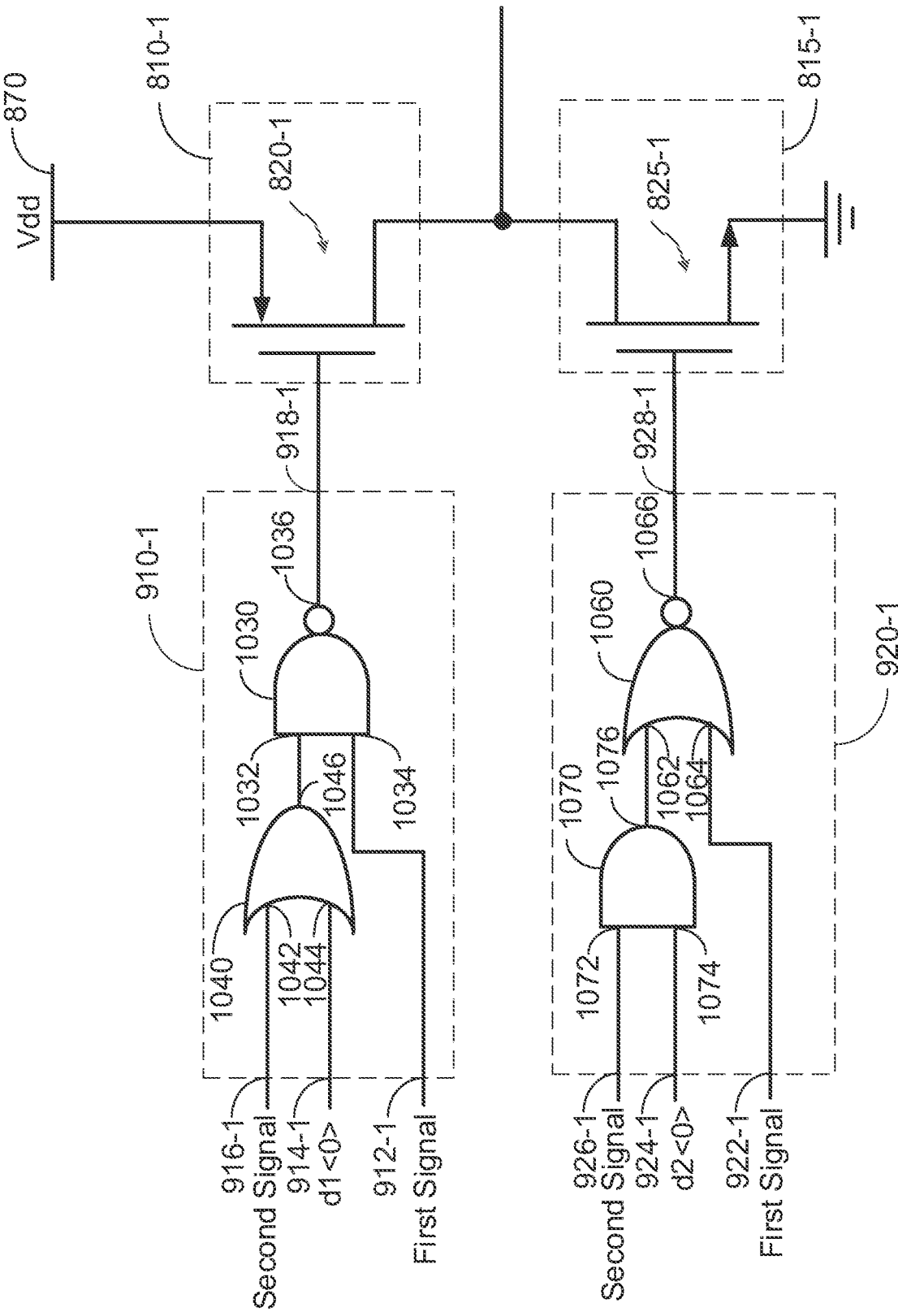
FIG. 10 shows an exemplary implementation of control devices in the first control circuit and the second control circuit according to certain aspects of the present disclosure.

FIG. 10 shows exemplary implementation of the control device 910-1 according to certain aspects. The exemplary implementation of the control device 910-1 shown in FIG. 10 may be duplicated for each of the other control devices 910-2 to 910-K.

In the example in FIG. 10, the control device 910-1 include an OR gate 1040 and a NAND gate 1030. The OR gate 1040 has a first input 1042, a second input 1044, and an output 1046. The first input 1042 of the OR gate 1040 is coupled to the second input 916-1 of control device 910-1 and therefore receives the second signal. The second input 1044 of the OR gate 1040 is coupled to the control input 914-1 of control device 910-1 and therefore receives bit d1<0> of the first delay code. The NAND gate 1030 has a first input 1032, a second input 1034, and an output 1036. The first input 1032 of the NAND gate 1030 is coupled to the output 1046 of the OR gate 1040. The second input 1034 of the NAND gate 1030 is coupled to the first input 912-1 of control device 910-1, and therefore receives the first signal. The output 1036 of the NAND gate 1030 is coupled to the pull-up device 810-1.

In this example, the pull-up device 810-1 includes a respective transistor 820-1 that is implemented with a PFET. Thus, in this example, the pull-up device 810-1 is turned on when the control device 910-1 outputs a zero to the gate of the transistor 820-1 and turned off when the control device 910-1 outputs a one to the gate of the transistor 820-1.

When the bit d1<0> is one, the OR gate 1040 outputs a one to the NAND gate 1030. This causes the NAND gate 1030 to invert the first signal and input the inverted first signal to pull-up device 810-1, which turns on the pull-up device 810-1 on a rising edge of the first signal. This is because the NAND gate 1030 inverts the rising edge of the first signal into a falling edge at the gate of the transistor 820-1, which turns on the pull-up device 810-1 in this example.

When the bit d1<0> is zero, the OR gate 1040 outputs a one to the NAND gate 1030 on a rising edge of the second signal. Before the arrival of the rising edge of the second signal, the OR gate 1040 output a zero to the NAND gate 1030, which causes the NAND gate 1030 to output a one to the gate of the transistor 820-1 regardless of the logic value of the first signal. As a result, the pull-up device 810-1 remains turned off on the rising edge of the first signal. When the rising edge of the second signal arrives (e.g., after one coarse delay step from the rising edge of the first signal), the OR gate 1040 output a one to the NAND gate 1030. This causes the output 1036 of the NAND gate 1030 to go low, which turns on the pull-up device 810-1 in this example. Thus, when the bit d1<0> is zero in this example, the pull-up device 810-1 does not turn on until the rising edge of the second signal.

Thus, in this example, the first signal is input to the pull-up device 810-1 when the corresponding bit d1<0> of the first delay code is one, and the second signal is input to the pull-up device 810-1 when the corresponding bit d1<0> of the first delay code is zero. In this example, the control device 910-1 inverts the rising edges of the first and second signals in order to turn on the pull-up device 810-1 on the rising edge of the first signal or the rising edge of the second signal depending on the bit value of bit d1<0>.

As discussed above, the exemplary implementation of the control device 910-1 may be duplicated for each of the other control devices 910-2 to 910-K in which each of the other control devices 910-2 to 910-K receives a respective one of the bits of the first delay code and is coupled to the respective one of the pull-up devices 810-2 to 810-K.

It is to be appreciated that the control device 910-1 is not limited to the exemplary implementation illustrated in FIG. 10, and that the control device 910-1 may be implemented with various combinations of logic gates configured to perform the functions described herein.

FIG. 10 also shows exemplary implementation of the control device 920-1 for controlling the input of the first signal and the second signal to pull-down device 815-1. The exemplary implementation of the control device 920-1 shown in FIG. 10 may be duplicated for each of the other control devices 920-2 to 920-L.

In the example in FIG. 10, the control device 920-1 includes an AND gate 1070 and a NOR gate 1060. The AND gate 1070 has a first input 1072, a second input 1074, and an output 1076. The first input 1072 of the AND gate 1070 is coupled to the second input 926-1 of the control device 920-1, and therefore receives the second signal. The second input 1074 of the AND gate 1070 is coupled to the control input 924-1 of the control device 920-1 and therefore receives bit d2<0> of the second delay code. The NOR gate 1060 has a first input 1062, a second input 1064, and an output 1066. The first input 1062 of the NOR gate 1060 is coupled to the output 1076 of the AND gate 1070. The second input 1064 of the NOR gate 1060 is coupled to the first input 922-1 of the control device 920-1, and therefore receives the first signal. The output 1066 of the NOR gate 1060 is coupled to the pull-down device 815-1.

In this example, the pull-down device 815-1 includes a respective transistor 825-1 that is implemented with an NFET. Thus, in this example, the pull-down device 815-1 is turned on when the control device 920-1 outputs a one to the gate of the transistor 825-1 and turned off when the control device 920-1 outputs a zero to the gate of the transistor 825-1.

When the bit d2<0> is zero, the AND gate 1070 outputs a zero to the NOR gate 1060. This causes the NOR gate 1060 to invert the first signal and input the inverted first signal to pull-down device 815-1, which turns on the pull-down device 815-1 on a falling edge of the first signal. This is because the NOR gate 1060 inverts the falling edge of the first signal into a rising edge at the gate of the transistor 825-1, which turns on the pull-down device 815-1 in this example.

When the bit d2<0> is one, the AND gate 1070 outputs a zero to the NOR gate 1060 gate on a falling edge of the second signal. Before the arrival of the falling edge of the second signal, the AND gate 1070 output a one to the NOR gate 1060, which causes the NOR gate 1060 to output a zero to the gate of the transistor 825-1 regardless of the logic value of the first signal. As a result, the pull-down device 815-1 remains turned off on the falling edge of the first signal. When the falling edge of the second signal arrives (e.g., after one coarse delay step from the falling edge of the first signal), the AND gate 1070 output a zero to the NOR gate 1060. This causes the output 1066 of the NOR gate 1060 to go high, which turns on the pull-down device 815-1 in this example. Thus, when the bit d2<0> is one in this example, the pull-down device 815-1 does not turn on until the falling edge of the second signal.

Thus, in this example, the first signal is input to the pull-down device 815-1 when the corresponding bit d2<0> of the second delay code is zero, and the second signal is input to the pull-down device 815-1 when the corresponding bit d2<0> of the second delay code is one. In this example, the control device 920-1 inverts the falling edges of the first and second signals in order to turn on the pull-down device 815-1 on the falling edge of the first signal or the falling edge of the second signal depending on the bit value of bit d2<0>.

As discussed above, the exemplary implementation of the control device 920-1 may be duplicated for each of the other control devices 920-2 to 920-L in which each of the other control devices 920-2 to 920-L receive a respective one of the bits of the second delay code and is coupled to a respective one of the pull-down devices 815-2 to 815-L.

It is to be appreciated that the control device 920-1 is not limited to the exemplary implementation illustrated in FIG. 10, and that the control device 920-1 may be implemented with various combinations of logic gates configured to perform the functions described herein.

Figure 11:
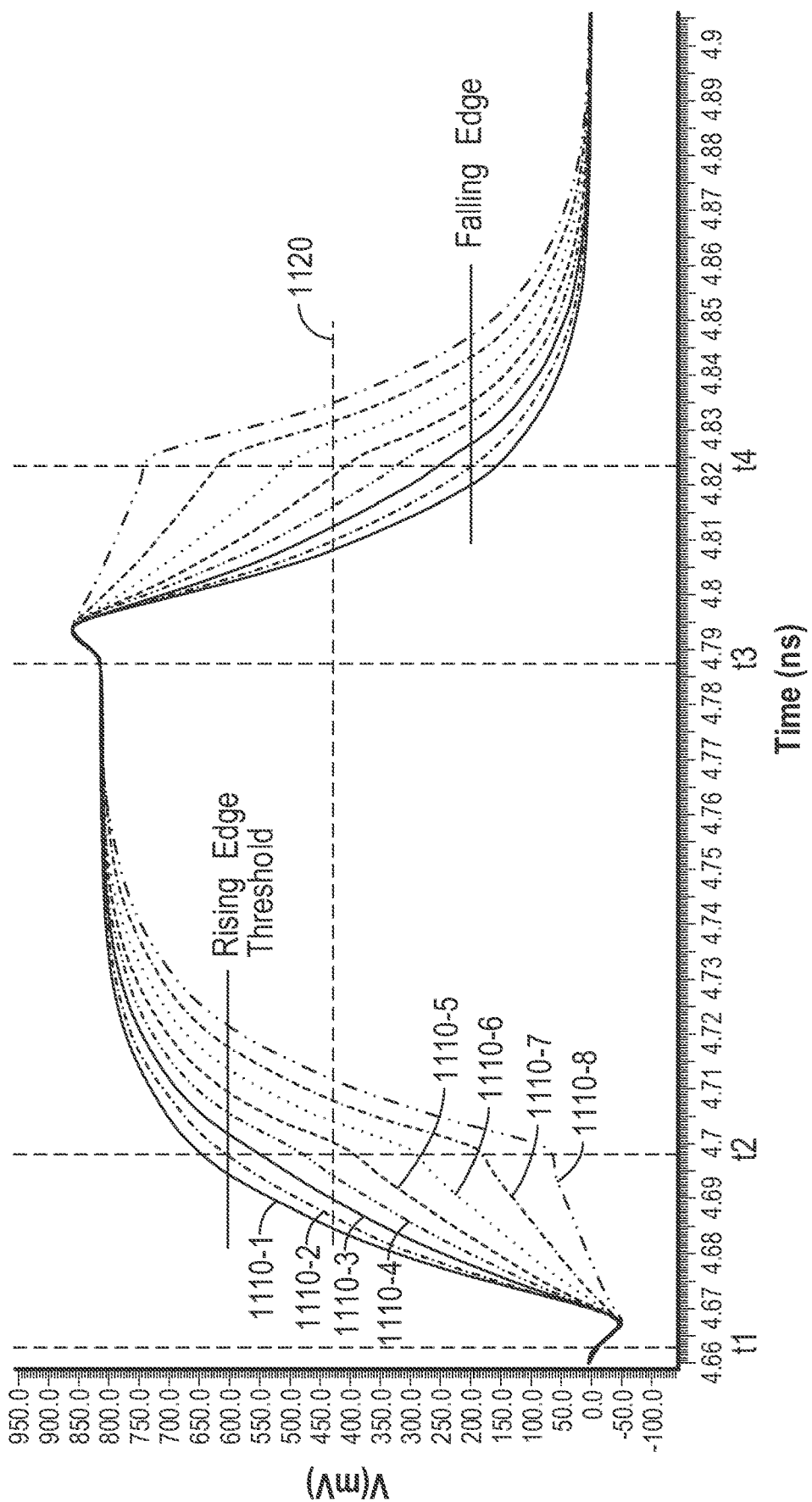
FIG. 11 is a plot showing exemplary waveforms for different delay settings according to certain aspects of the present disclosure.

FIG. 11 is a timing diagram showing exemplary voltage waveforms 1110-1 to 1110-8 at the node 830 for different delay settings of the first delay code and the second delay code according to certain aspects. Waveform 1110-1 corresponds to a delay setting in which all of the pull-up devices 810-1 to 810-K receive the first signal and all of the pull-down devices 815-1 to 815-L receive the first signal. In the example shown in FIG. 11, the output buffer 860 has a rising edge threshold and a falling edge threshold, in which the output buffer 860 is configured to transition the output 864 from zero to one when a rising edge at the input 862 crosses the rising edge threshold and transition the output 864 from one to zero when a falling edge at the input 862 crosses the falling edge threshold.

In the example in FIG. 11, a rising edge of the first signal arrives at the delay interpolator 630 at time t1. As shown by the waveforms 1110-1 to 1110-8 in FIG. 11, the slew rate at the node 830 is different for the different delay settings of the first delay code. In this example, the slew rate is slower when the number of the pull-up devices 810-1 to 810-K receiving the first signal is smaller. This is because the number of the pull-up devices 810-1 to 810-K that are turned on is smaller, which results in less current to charge the capacitor 845 to pull the node 830 up. For example, waveform 1110-8 corresponds to a delay setting in which one less pull-up device receives the first signal compared with waveform 1110-7. This causes waveform 1110-8 to have a slower slew rate than waveform 1110-7, as shown in FIG. 11.

The corresponding rising edge of the second signal arrives at the delay interpolator 630 at time t2 (e.g., one coarse delay step after the rising edge of the first signal). At this point, the waveforms 1110-1 to 1110-8 for the different delay settings have the same slew rate. This is because the rising edge of the second signal causes the remaining pull-up devices to turn on. In other words, after the rising edge of the second signal arrives, all of the pull-up devices 810-1 to 810-K are turned on. As shown in FIG. 11, the waveforms 1110-1 to 1110-8 for the different delay settings cross the rising edge threshold of the output buffer 860 at different times. This causes the output 864 of the output buffer 860 to transition from zero to one at different times for the different delay settings of the first delay code, resulting in different delays at the output 864 for the different delay settings.

In the example in FIG. 11, the different waveforms 1110-1 to 1110-8 are approximately evenly spaced at the rising edge threshold. This results in approximately uniform fine delay steps at the output 864 of the output buffer 860. In this example, the even spacing between the different waveforms 1110-1 to 1110-8 at the rising edge threshold (and hence the approximately uniform fine delay steps at the output 864) is achieved by setting the rising edge threshold above the waveforms 1110-2 to 1110-8 until the arrival of the rising edge of the second signal.

In the example in FIG. 11, a falling edge of the first signal arrives at the delay interpolator 630 at time 3. As shown by the waveforms 1110-1 to 1110-8 in FIG. 11, the slew rate at the node 830 is different for the different delay settings of the second delay code. In this example, the slew rate is slower when the number of the pull-down devices 815-1 to 815-L receiving the first signal is smaller. This is because the number of the pull-down devices 815-1 to 815-L that are turned on is smaller, which results in less current to discharge the capacitor 845 to pull the node 830 down.

The corresponding falling edge of the second signal arrives at the delay interpolator 630 at time t4 (e.g., one coarse delay step after the falling edge of the first signal). At this point, the waveforms 1110-1 to 1110-8 for the different delay settings have the same slew rate. This is because the falling edge of the second signal causes the remaining pull-down devices to turn on. In other words, after the falling edge of the second signal arrives, all of the pull-down devices 815-1 to 815-L are turned on. As shown in FIG. 11, the waveforms 1110-1 to 1110-8 for the different delay settings cross the falling edge threshold of the output buffer 860 at different times. This causes the output 864 of the output buffer 860 to transition from one to zero at different times for the different delay settings of the second delay code, resulting in different delays at the output 864 for the different delay settings.

In the example in FIG. 11, the different waveforms 1110-1 to 1110-8 are approximately evenly spaced at the falling edge threshold. This results in approximately uniform fine delay steps at the output 864 of the output buffer 860. In this example, the even spacing between the different waveforms 1110-1 to 1110-8 at the falling edge threshold (and hence the approximately uniform fine delay steps at the output 864) is achieved by setting the falling edge threshold below the waveforms 1110-2 to 1110-8 until the arrival of the falling edge of the second signal.

In the example in FIG. 11, the rising edge threshold and the falling edge threshold allow the output buffer 860 to achieve approximately uniform fine delay steps at the output 864 for both rising edges and falling edges. In the example in FIG. 11, using a single threshold for the output buffer 860 results in non-uniform fine delay steps. In this regard, FIG. 11 shows an example of a single threshold 1120 located at approximately Vdd/2. As shown in FIG. 11, the waveforms 1110-1 to 1110-8 are not evenly spaced at the threshold 1120, resulting in non-uniform fine delay steps for both rising edges and falling edges at the output 864.

However, it is to be appreciated that, in other implementations, the output buffer 860 may have a single threshold. In this example, the output buffer 860 is configured to transition the output 864 from zero to one when the voltage at the input 862 rises above the threshold and transition the output 864 from one to zero when the voltage at the input 862 falls below the threshold. A single threshold may be used, for example, for the case where the waveforms for the different delay settings for the rising edge stay below Vdd/2 until the arrival of the second signal and the waveforms for the different delay settings for the falling edge stay above Vdd/2 until the arrival of the second signal. In this case, the output buffer 860 may achieve approximately uniform fine delay steps at the output 864 for both rising edges and falling edges by setting the threshold to approximately Vdd/2. An advantage of using the rising edge threshold and the falling edge threshold for the output buffer 860 instead of a single threshold is that the rising edge threshold and the falling edge threshold relax the requirements on the waveforms for achieving approximately uniform fine delay steps at the output 864 for both rising edges and falling edges.

In the example discussed above with reference to FIG. 11, the output buffer 860 transitions the output 864 from zero to one when a rising edge at the input 862 crosses the rising edge threshold and transitions the output 864 from one to zero when a falling edge at the input 862 crosses the falling edge threshold. However, it is to be appreciated that the output buffer 860 is not limited to this example. In other implementations, the output buffer 860 may be an inverting output buffer in which the output buffer 860 transitions the output 864 from one to zero when a rising edge at the input 862 crosses the rising edge threshold and transitions the output 864 from zero to one when a falling edge at the input 862 crosses the falling edge threshold. In these implementations, the first control circuit 840 may be used to tune the fine delay of a falling edge at the output 638 of the delay interpolator 630, and the second control circuit 850 may be used to tune the fine delay of a rising edge at the output 638 of the delay interpolator 630. In general, the output buffer 860 may be configured to transition the output 864 from a first logic state to a second logic state when a rising edge at the input 862 crosses the rising edge threshold, and transition the output 864 from the second logic state to the first logic state when a falling edge at the input 862 crosses the falling edge threshold. The first logic state may be zero and the second logic state may be one, or vise versa.

Figure 12:
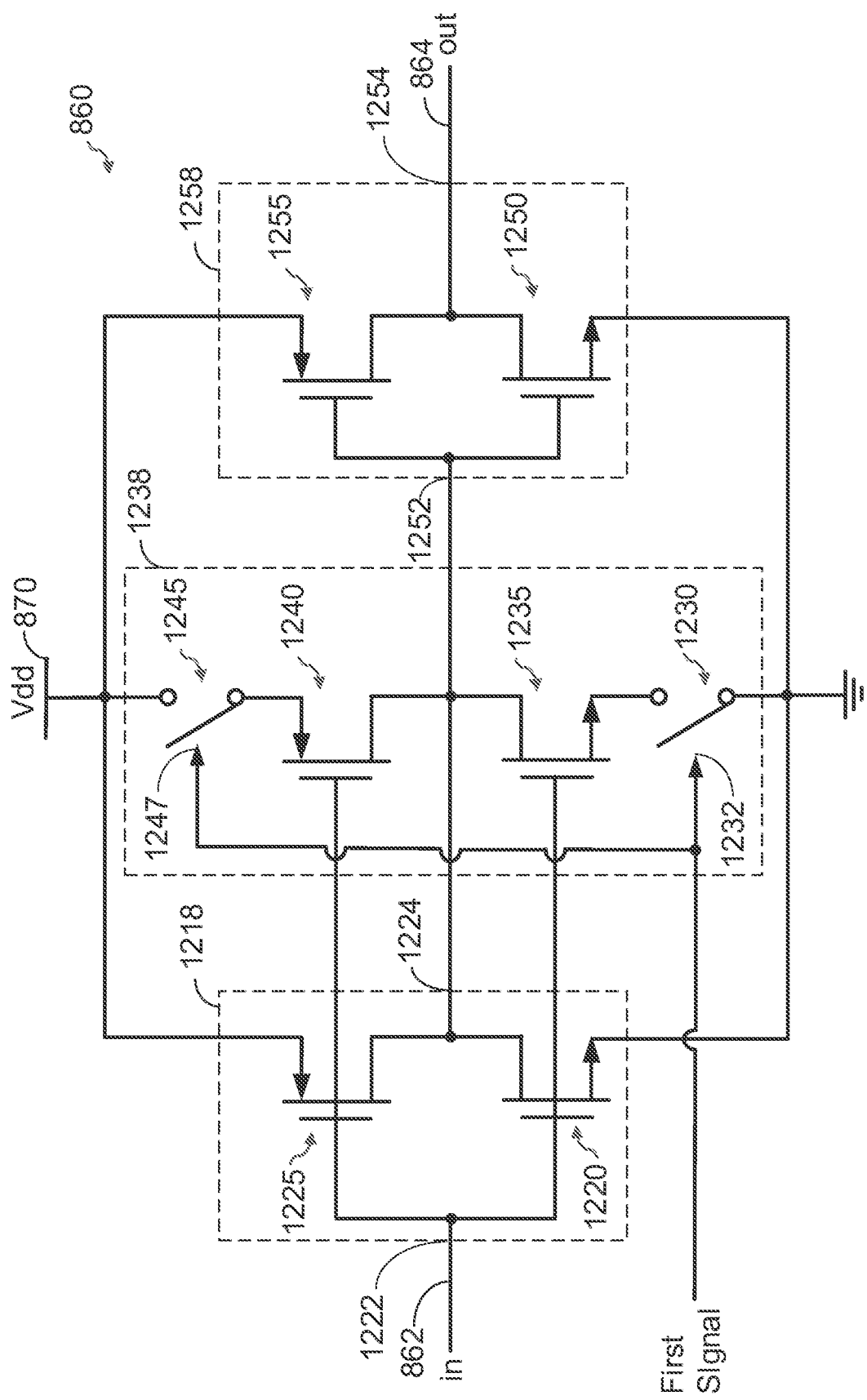
FIG. 12 shows an exemplary implementation of an output buffer according to certain aspects of the present disclosure.

FIG. 12 shows an exemplary implementation of the output buffer 860 according to certain aspects of the present disclosure. In this example, the output buffer 860 includes a first inverter 1218, a second inverter 1258, and a threshold circuit 1238. The first inverter 1218 has an input 1222 coupled to the input 862 of the output buffer 860, and an output 1224. The second inverter 1258 has an input 1252 coupled to the output 1224 of the first inverter 1218, and an output 1254 coupled to the output 864 of the output buffer 860. In the example in FIG. 12, the first inverter 1218 and the second inverter 1258 are implemented with complementary inverters. More particularly, the first inverter 1218 includes a PFET 1225 and an NFET 1220, in which the gates of the PFET 1225 and the NFET 1220 are coupled to the input 1222, the source of the PFET 1225 is coupled to the supply rail 870, the drains of the PFET 1225 and the NFET 1220 are coupled to the output 1224, and the source of the NFET 1220 is coupled to ground. The second inverter 1258 includes a PFET 1255 and an NFET 1250, in which the gates of the PFET 1255 and the NFET 1250 are coupled to the input 1252, the source of the PFET 1255 is coupled to the supply rail 870, the drains of the PFET 1255 and the NFET 1250 are coupled to the output 1254, and the source of the NFET 1250 is coupled to ground.

In this example, the threshold circuit 1238 is configured to switch the input 1222 of the first inverter 1218 between the rising edge threshold and the falling edge threshold based on the first signal, as discussed further below. The threshold circuit 1238 includes a PFET 1240 and a first switch 1245. The gate of the PFET 1240 is coupled to the gate of the PFET 1225 in the first inverter 1218, and the drain of the PFET 1240 is coupled to the drain of the PFET 1225 in the first inverter 1218. The first switch 1245 is coupled between the source of the PFET 1240 and the supply rail 870. The first switch 1245 has a control input 1247 coupled to the first input 634 of the delay interpolator 630 to receive the first signal.

In this example, the first switch 1245 is configured to turn on when the first signal is one and turn off when the first signal is zero. When the first switch 1245 turns on, the first switch 1245 couples the source of the PFET 1240 to the supply rail 870, which couples the PFET 1240 in parallel with the PFET 1225 in the first inverter 1218. As a result, the PFET 1240 increases the current drive from the supply rail 870 to the output 1224 of the first inverter 1218 which increases the threshold of the first inverter 1218 to the rising edge threshold. In this example, the rising edge threshold may be set to a desired voltage by setting the ratio between the size (e.g., width) of the PFET 1240 to the size (e.g., width) of the NFET 1220 accordingly. The larger the ratio, the higher the rising edge threshold.

The threshold circuit 1238 also includes an NFET 1235 and a second switch 1230. The gate of the NFET 1235 is coupled to the gate of the NFET 1220 in the first inverter 1218, and the drain of the NFET 1235 is coupled to the drain of the NFET 1220 in the first inverter 1218. The second switch 1230 is coupled between the source of the NFET 1235 and the ground. The second switch 1230 has a control input 1232 coupled to the first input 634 of the delay interpolator 630 to receive the first signal.

In this example, the second switch 1230 is configured to turn on when the first signal is zero and turn off when the first signal is one. When the second switch 1230 turns on, the second switch 1230 couples the source of the NFET 1235 to ground, which couples the NFET 1235 in parallel with the NFET 1220 in the first inverter 1218. As a result, the NFET 1235 increases the current drive from the output 1224 of the first inverter 1218 to ground which decreases the threshold of the first inverter 1218 to the falling edge threshold. In this example, the falling edge threshold may be set to a desired voltage by setting the ratio between the size (e.g., width) of the NFET 1235 to the size (e.g., width) of the PFET 1225 accordingly. The larger the ratio, the lower the falling edge threshold.

Thus, in this example, the threshold circuit 1238 sets the threshold of the first inverter 1218 to the rising edge threshold when the first signal is one, and sets the threshold of the first inverter 1218 to the falling edge threshold when the first signal is zero.

It is to be appreciated that the output buffer 860 is not limited to the exemplary implementation shown in FIG. 12. For example, the output buffer 860 may be implemented with an output buffer with built-in hysteresis (e.g., Schmitt-trigger buffer), or another type of output buffer.

Figure 13:
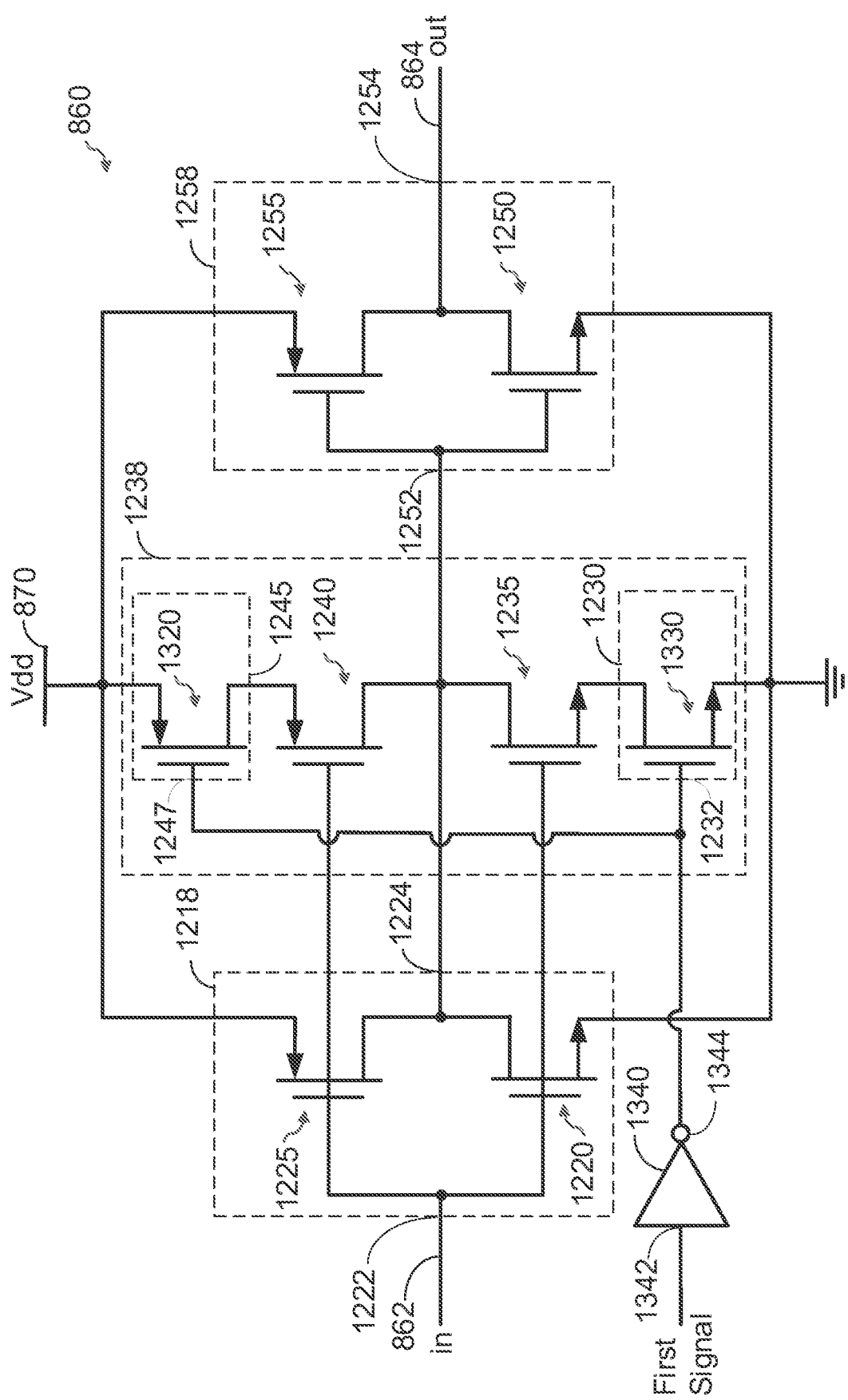
FIG. 13 shows an exemplary implementation of switches in the output buffer according to certain aspects of the present disclosure.

FIG. 13 shows an exemplary implementation of the first switch 1245 and the second switch 1230. In this example, the first switch 1245 includes a PFET 1320 coupled between the PFET 1240 and the supply rail 870. The gate of the PFET 1320 is coupled to the first input 634 of the delay interpolator 630 via an inverter 1340 so that the PFET 1320 turns on when the first signal is one. The inverter 1340 has an input 1342 coupled to the first input 634 of the delay interpolator 630 and an output 1344 coupled to the gate of the PFET 1320.

In this example, the second switch 1230 includes an NFET 1330 coupled between the NFET 1235 and ground. The gate of the NFET 1330 is coupled to the first input 634 of the delay interpolator 630 via the inverter 1340 so that the NFET 1330 turns on when the first signal is zero. The output 1344 of the inverter 1340 is also coupled to the gate of the NFET 1330.

In the examples discussed above, the output buffer 860 is assumed to be non-inverting. However, it is to be appreciated that this need not be the case. For the case where the output buffer 860 is inverting, the first control circuit 840 may control the fine delay of the falling edge at the output 638 of the delay interpolator 630 based on the first delay code, and the second control circuit 850 may control the fine delay of the rising edge at the output 638 of the delay interpolator 630 based on the second delay code. For example, the exemplary output buffer 860 shown in FIG. 12 may be made inverting by omitting the second inverter 1258 or adding another inverter.

Figure 14:
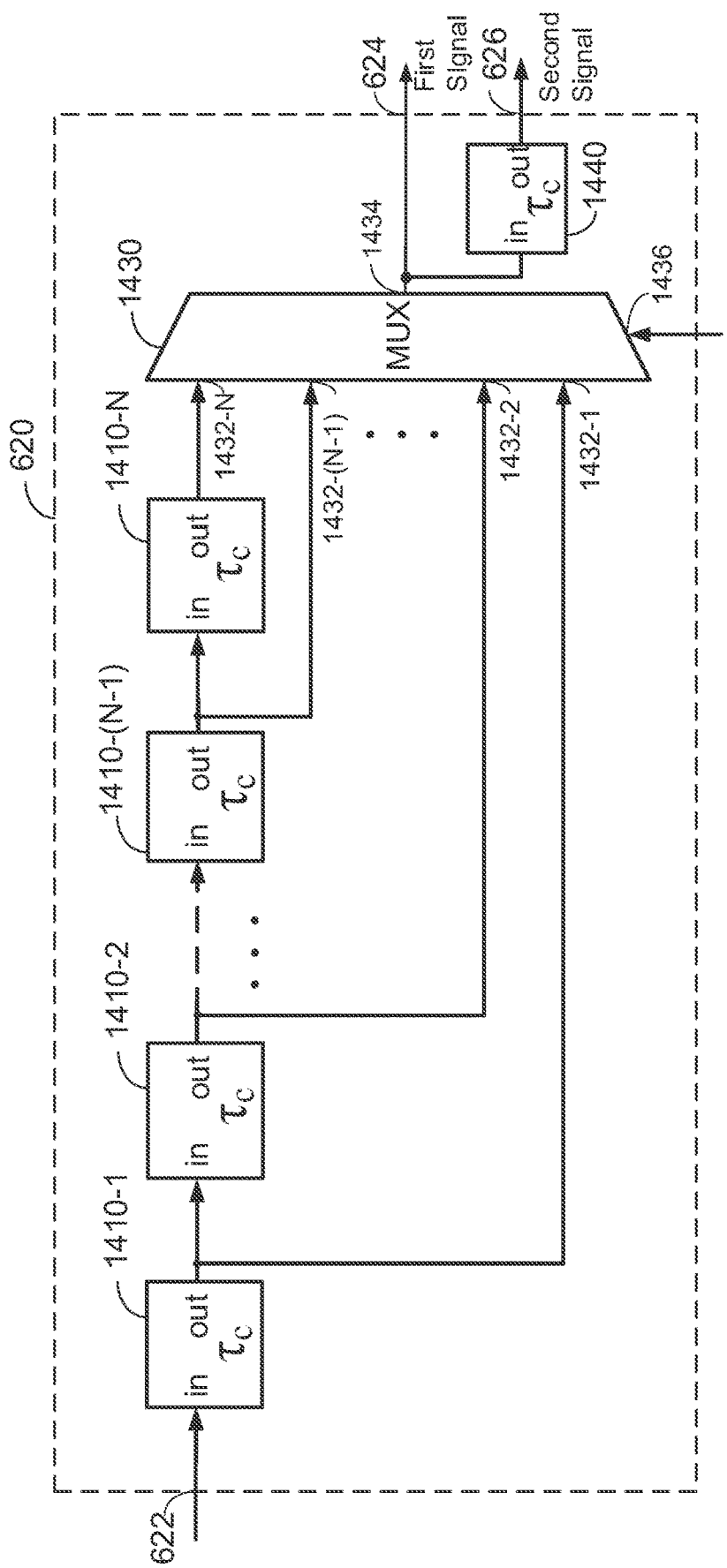
FIG. 14 shows another exemplary implementation of a coarse delay circuit according to certain aspects of the present disclosure.

As discussed above, the coarse delay circuit 620 is not limited to the exemplary implementation shown in FIG. 7. In this regard, FIG. 14 shows another exemplary implementation of the coarse delay circuit 620 according to certain aspects. In this example, the coarse delay circuit 620 includes multiple delay devices 1410-1 to 1410-N coupled in series to form a delay line (e.g., delay chain). Each of the delay devices 1410-1 to 1410-N has a respective input (labeled "in") and a respective output (labeled "out"). Each of the delay devices 1410-1 to 1410-N may have a delay of one coarse delay step $\tau_c$. The input of delay device 1410-1 is coupled to the input 622 of the coarse delay circuit 620. The output of each of delay devices 1410-1 to 1410-(N−1) is coupled to the input of the next delay device 1410-2 to 1410-N in the delay line.

The coarse delay circuit 620 also includes a multiplexer 1430 having multiple inputs 1432-1 to 1432-N, an output 1434, and a select input 1436. Each of the inputs 1432-1 to 1432-N of the multiplexer 1430 is coupled to the output of a respective one of the delay devices 1410-1 to 1410-N in the delay line. As a result, each of the inputs 1432-1 to 1432-N is coupled to a different point on the delay line corresponding to a different delay. The output 1434 of the multiplexer 1430 is coupled to the first output 624, and the select input 1436 of the multiplexer 130 is coupled to the delay control circuit 650.

The multiplexer 1430 is configured to receive a select signal from the delay control circuit 650 at the select input 1436 and select one of the inputs 1432-1 to 1432-N of the multiplexer 1430 based on the received select signal, in which the selected one of the inputs 1432-1 to 1432-N is coupled to the output 1434 of the multiplexer 1430. Because each of the inputs 1432-1 to 1432-N is coupled to a different point on the delay line corresponding to a different delay, the delay control circuit 650 can use the select signal to control the tunable delay of the coarse delay circuit 620 by controlling which one of the inputs 1432-1 to 1432-N is selected by the multiplexer 1430. Thus, in this example, the select signal is the delay control signal used by the delay control circuit 650 to tune the delay of the coarse delay circuit 620. The output 1434 of the multiplexer 1430 provides the first signal at the first output 624.

In this example, the coarse delay circuit 620 also includes an additional delay device 1440 coupled between the output 1434 of the multiplexer 1430 and the second output 626 to provide the second signal. The additional delay device 1440 may delay the first signal at the output 1434 of the multiplexer 1430 by one coarse delay step $\tau_c$ to provide the second signal at the second output 626. Thus, in this example, the second delay signal is delayed with respect to the first delay signal by one coarse delay step $\tau_c$. Since the delay between the first signal and the second signal is produced by the additional delay device 1440 in the coarse delay circuit 620, the delay between the first signal and the second signal tracks changes in the coarse delay step caused by changes in the coarse delay circuit 620 due to PVT variations.

As discussed above with reference to FIG. 8, the first control circuit 840 and the second control circuit 850 allow the fine delay of a rising edge at the output 638 and the fine delay of a falling edge at the output 638 to be adjusted independently, which can be used to adjust the duty cycle of the delayed signal at the output 638. For example, the duty cycle of the delayed signal at the output 638 may be increased by increasing the delay of the falling edge relative to the rising edge (e.g., by increasing the delay setting of the second delay code). The duty cycle of the delayed signal at the output 638 may be decreased by decreasing the delay of the falling edge relative to the rising edge (e.g., by decreasing the delay setting of the second delay code).

For example, duty cycle adjustment may be used in a data interface to achieve a duty cycle of approximately 50 percent. In one example, the data interface may be a double-data rate (DDR) memory interface, in which data is captured from a received data signal on both rising edges and falling edges of a clock signal. In this example, a 50 percent duty cycle for the clock signal is desirable so that data capture on the rising edges and falling edges of the clock signal are evenly spaced. In this example, the delay circuit 610 may be used to delay the clock signal (e.g., to center the edges of the clock signal between transitions of the data signal). In addition, the first control circuit 840 and the second control circuit 850 may be used to adjust the duty cycle of the delayed clock signal to achieve a 50 percent duty cycle.

Figure 15:
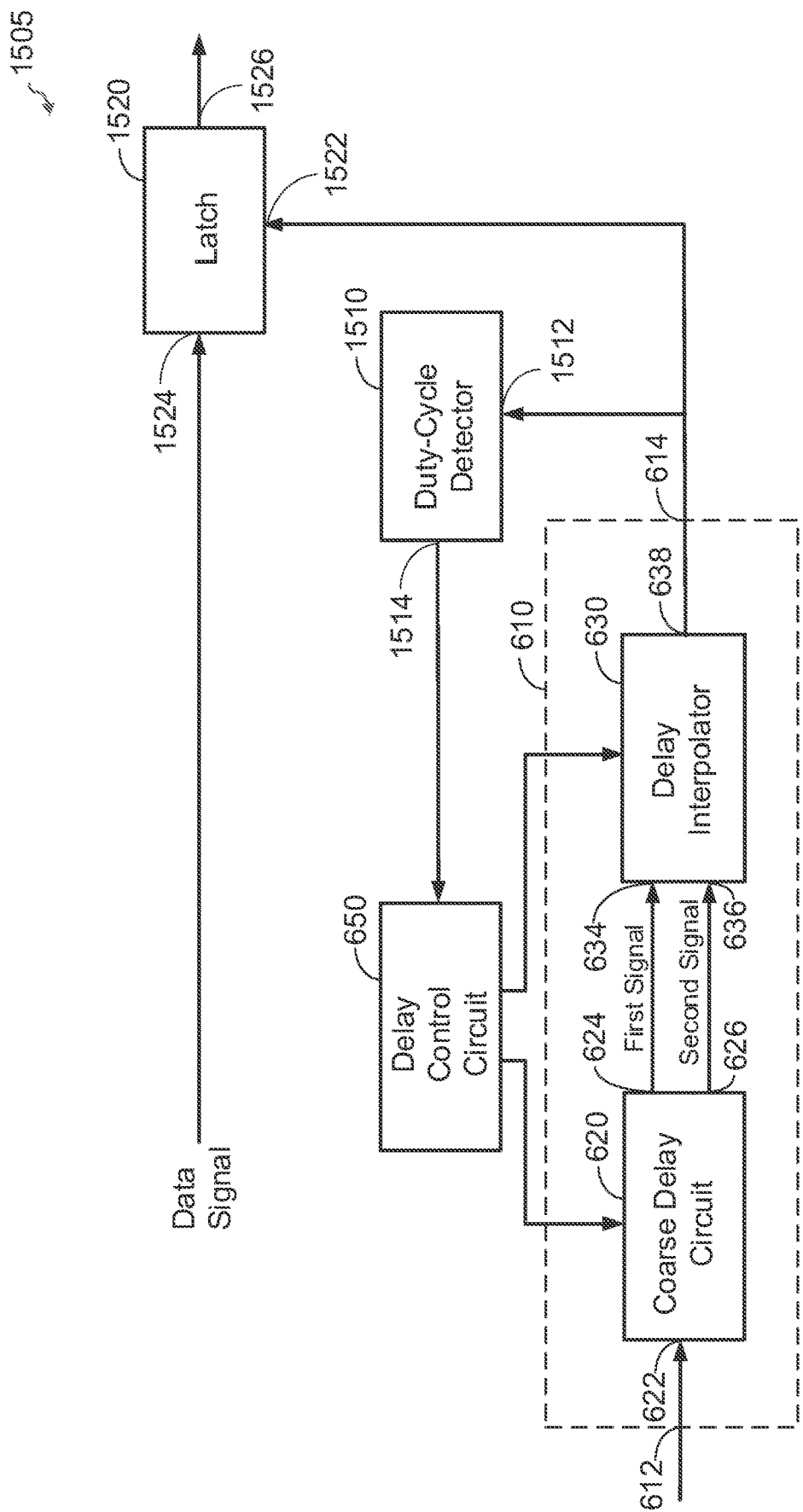
FIG. 15 shows an example of a data interface including a delay circuit according to certain aspects of the present disclosure.

In this regard, FIG. 15 shows an example of a data interface 1505 (e.g., DDR memory interface) according to certain aspects of the present disclosure. In this example, the data interface 1505 includes the delay circuit 610 and the delay control circuit 650. The data interface 1505 also include a duty-cycle detector 1510, and a latch 1520. The duty-cycle detector 1510 has an input 1512 coupled to the output 614 of the delay circuit 610 and an output 1514 coupled to the delay control circuit 650. The latch 1520 has a data input 1524, a clock input 1522, and an output 1526.

In this example, the delay circuit 610 receives a clock signal at the input 612, delays the clock signal, and outputs the delayed clock signal at the output 614. In one example, the latch 1520 receives a data signal at the data input 1524, and the delay control circuit 650 adjusts the delay of the delay circuit 610 to align edges of the delayed clock signal between transitions of the data signal. In this example, the latch 1520 receives the delayed clock signal at the clock input 1522, captures (i.e., latches) data bits from the received data signal on rising edges and falling edges of the delayed clock signal, and outputs the data bits at the output 1526. For the example of a memory interface, the data bits may be output to read-write circuitry to write the data bits into a memory, and/or to a processor for further processing.

In this example, the duty-cycle detector 1510 is configured to detect the duty cycle of the delayed clock signal, compare the detected duty cycle with a target duty cycle (e.g., 50 percent), and send commands to the delay control circuit 650 based on the comparison to adjust the duty cycle to reduce the difference between the detected duty cycle and the target duty cycle. For example, if the detected duty cycle is greater than the target duty cycle, then the duty-cycle detector 1510 may instruct the delay control circuit 650 to decrease the duty cycle. In response, the delay control circuit 650 may decrease the duty cycle by decreasing the delay of the falling edge relative to the rising edge (e.g., by decreasing the delay setting of the second delay code). If the detected duty cycle is less than the target duty cycle, then the duty-cycle detector 1510 may instruct the delay control circuit 650 to increase the duty cycle. In response, the delay control circuit 650 may increase the duty cycle by increasing the delay of the falling edge relative to the rising edge (e.g., by increasing the delay setting of the second delay code).

In one example, the data interface 1505 may also include a coarse duty cycle adjustor (not shown). In this example, the duty-cycle detector 1510 may use the coarse duty cycle adjuster to make coarse adjustments to the duty cycle of the clock signal and use the delay circuit 610 to make fine adjustments to the duty cycle of the clock signal based on the comparison of the detected duty cycle with the target duty cycle.

Figure 16:
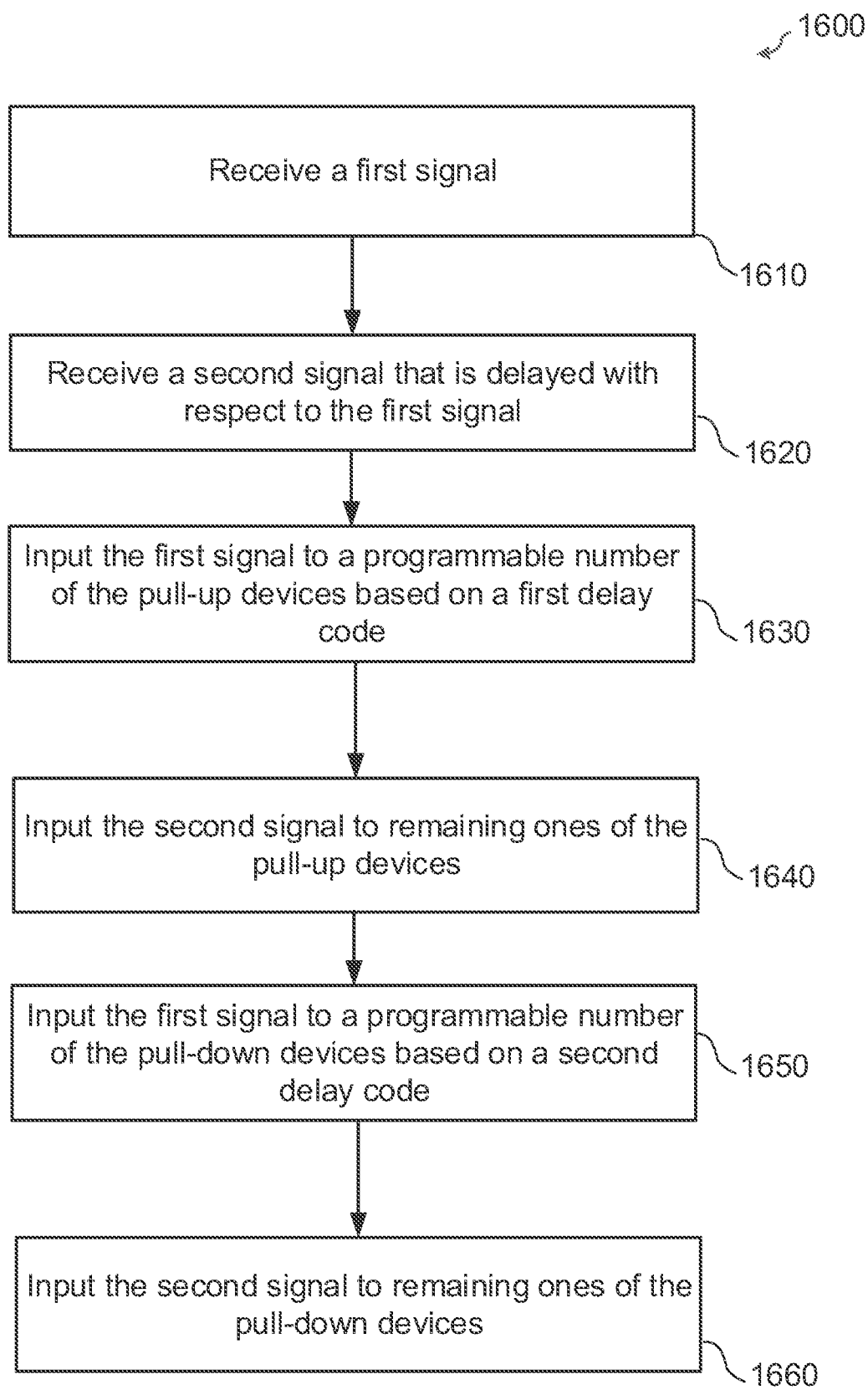
FIG. 16 is a flowchart illustrating a method of operating a delay interpolator according to certain aspects of the present disclosure.

FIG. 16 illustrates a method 1600 of operating a delay interpolator according to certain aspects of the present disclosure. The delay interpolator (e.g., delay interpolator 630) includes pull-up devices (e.g., pull-up devices 810-1 to 810-K) coupled between a supply rail (e.g., supply rail 870) and a node (e.g., node 830), and pull-down devices (e.g., pull-down devices 815-1 to 815-L) coupled between the node and a ground.

At block 1610, a first signal is received. For example, the first signal may be received from a coarse delay circuit (e.g., coarse delay circuit 620).

At block 1620, a second signal that is delayed with respect to the first signal is received. For example, the second signal may be received from the coarse delay circuit (e.g., coarse delay circuit 620). In one example, the second signal may be delayed with respect to the first signal by one coarse delay step of the coarse delay circuit. In certain aspects, the coarse delay circuit delays an input signal (e.g., data signal, clock signal, etc.) by a tunable delay to provide the first signal and delays the input signal by the tunable delay and an additional delay (e.g., one coarse delay step) to provide the second signal.

At block 1630, the first signal is input to a programmable number of the pull-up devices based on a first delay code. For example, the first signal may be input to the programmable number (e.g., number n) of the pull-up devices based on the first delay code by the first control circuit 840. In this example, the programmable number n is the number of the pull-up devices (e.g., pull-up devices 810-1 to 810-K) to which the first control circuit 840 inputs the first signal based on the first delay code.

At block 1640, the second signal is input to remaining ones of the pull-up devices. For example, the second signal may be input to the remaining ones of the pull-up devices by the first control circuit 840.

At block 1650, the first signal is input to a programmable number of the pull-down devices based on a second delay code. For example, the first signal may be input to the programmable number (e.g., number m) of the pull-down devices based on the second delay code by the second control circuit 850. In this example, the programmable number m is the number of the pull-down devices (e.g., pull-down devices 815-1 to 815-L) to which the second control circuit 850 inputs the first signal based on the second delay code.

At block 1660, the second signal is input to remaining ones of the pull-down devices. For example, the second signal may be input to the remaining ones of the pull-down devices by the second control circuit 850.

In one example, the first delay code and the second delay code may be different (e.g., to adjust the duty cycle). In another example, the first delay code and the second delay code may be the same. For example, the first delay code and the second delay code may be the same in cases where the delay circuit 610 is used for interpolation.

In certain aspects, the first delay code includes bits (e.g., d1<K−1:0>). In these aspects, inputting the first signal to the programmable number of the pull-up devices based on the first delay code includes, for each of the pull-up devices, inputting the first signal to the pull-up device if a respective one of the bits of the first delay code has a first logic value. In these aspects, inputting the second signal to the remaining ones of the pull-up devices may include, for each of the pull-up devices, inputting the second signal to the pull-up device if the respective one of the bits of the first delay code has a second logic value.

In certain aspects, the second delay code includes bits (e.g., d2<L−1:0>). In these aspects, inputting the first signal to the programmable number of the pull-down devices based on the second delay code includes, for each of the pull-down devices, inputting the first signal to the pull-down device if a respective one of the bits of the second delay code has a first logic value. In these aspects, inputting the second signal to the remaining ones of the pull-down devices may include, for each of the pull-down devices, inputting the second signal to the pull-down device if the respective one of the bits of the second delay code has a second logic value.

Implementation examples are described in the following numbered clauses:

1. A delay interpolator, comprising:
   pull-up devices, wherein each of the pull-up devices is coupled between a supply rail and a node;
   pull-down devices, wherein each of the pull-down devices is coupled between the node and a ground;
   a first control circuit coupled to the pull-up devices, wherein the first control circuit has a first input configured to receive a first signal, a second input configured to receive a second signal that is delayed with respect to the first signal, and a control input configured to receive a first delay code; and
   a second control circuit coupled to the pull-down devices, wherein the second control circuit has a first input configured to receive the first signal, a second input configured to receive the second signal, and a control input configured to receive a second delay code.

2. The delay interpolator of clause 1, wherein each of the pull-up devices comprises a respective transistor having a gate coupled to the first control circuit.

3. The delay interpolator of clause 2, wherein each of the pull-down devices comprises a respective transistor having a gate coupled to the second control circuit.

4. The delay interpolator of any one of clauses 1 to 3, wherein each of the pull-up devices comprises a respective p-type field effect transistor having a gate coupled to the first control circuit, a source coupled to the supply rail, and a drain coupled to the node.

5. The delay interpolator of any one of clauses 1 to 4, wherein each of the pull-down devices comprises a respective n-type field effect transistor having a gate coupled to the second control circuit, a drain coupled to the node, and a source coupled to the ground.

6. The delay interpolator of any one of clauses 1 to 5, wherein the first delay code and the second delay code are different.

7. The delay interpolator of any one clauses 1 to 5, wherein the first delay code and the second delay code are the same.

8. The delay interpolator of any one of clauses 1 to 7, further comprising an output buffer having an input coupled to the node, and an output.

9. The delay interpolator of clause 8, wherein the output buffer has a rising edge threshold and a falling edge threshold, and the output buffer is configured to transition the output of the output buffer from a first logic state to a second logic state when a rising edge at the input of the output buffer crosses the rising edge threshold, and transition the output of the output buffer from the second logic state to the first logic state when a falling edge at the input of the output buffer crosses the falling edge threshold.

10. The delay interpolator of any one of clauses 1 to 9, further comprising a capacitor coupled between the node and the ground.

11. The delay interpolator of any one of clauses 1 to 10, wherein:
the first delay code comprises multiple bits;
the first control circuit comprises a first plurality of control devices; and
each of the first plurality of control devices has a respective first input coupled to the first input of the first control circuit, a respective second input coupled to the second input of the first control circuit, a respective control input configured to receive a respective one of the bits of the first delay code, and a respective output coupled to a respective one of the pull-up devices.

12. The delay interpolator of clause 11, wherein each of the first plurality of control devices is configured to input the first signal or the second signal to the respective one of the pull-up devices based on a logic value of the respective one of the bits of the first delay code.

13. The delay interpolator of clause 11 or 12, wherein:
the second delay code comprises multiple bits;
the second control circuit comprises a second plurality of control devices; and
each of the second plurality of control devices has a respective first input coupled to the first input of the second control circuit, a respective second input coupled to the second input of the second control circuit, a respective control input configured to receive a respective one of the bits of the second delay code, and a respective output coupled to a respective one of the pull-down devices.

14. The delay interpolator of clause 13, wherein:
each of the first plurality of control devices is configured to input the first signal or the second signal to the respective one of the pull-up devices based on a logic value of the respective one of the bits of the first delay code; and
each of the second plurality of control devices is configured to input the first signal or the second signal to the respective one of the pull-down devices based on a logic value of the respective one of the bits of the second delay code.

15. The delay interpolator of any one of clauses 1 to 14, wherein the first control circuit is configured to input the first signal to a programmable number of the pull-up devices based on the first delay code, and input the second signal to remaining ones of the pull-up devices.

16. The delay interpolator of any one of clauses 1 to 15, wherein the second control circuit is configured to input the first signal to a programmable number of the pull-down devices based on the second delay code, and input the second signal to remaining ones of the pull-down devices.

17. A method of operating a delay interpolator including pull-up devices coupled between a supply rail and a node, and pull-down devices coupled between the node and a ground, the method comprising:
receiving a first signal;
receiving a second signal that is delayed with respect to the first signal;
inputting the first signal to a programmable number of the pull-up devices based on a first delay code;
inputting the second signal to remaining ones of the pull-up devices;
inputting the first signal to a programmable number of the pull-down devices based on a second delay code; and
inputting the second signal to remaining ones of the pull-down devices.

18. The method of clause 17, wherein the first delay code and the second delay code are different.

19. The method of clause 17, wherein the first delay code and the second delay code are the same.

20. The method of any one of clauses 17 to 19, wherein:
the first delay code comprises bits; and
inputting the first signal to the programmable number of the pull-up devices based on the first delay code comprises:
for each of the pull-up devices, inputting the first signal to the pull-up device if a respective one of the bits of the first delay code has a first logic value.

21. The method of clause 20, wherein inputting the second signal to the remaining ones of the pull-up devices comprises:
for each of the pull-up devices, inputting the second signal to the pull-up device if the respective one of the bits of the first delay code has a second logic value.

22. The method of any one of clauses 17 to 21, wherein:
the second delay code comprises bits; and
inputting the first signal to the programmable number of the pull-down devices based on the second delay code comprises:
for each of the pull-down devices, inputting the first signal to the pull-down device if a respective one of the bits of the second delay code has a first logic value.

23. The method of clause 22, wherein inputting the second signal to the remaining ones of the pull-down devices comprises:
for each of the pull-down devices, inputting the second signal to the pull-down device if the respective one of the bits of the second delay code has a second logic value.

24. A system, comprising:
a delay circuit having an input, a first output, and a second output; and
a delay interpolator, comprising:
pull-up devices, wherein each of the pull-up devices is coupled between a supply rail and a node;
pull-down devices, wherein each of the pull-down devices is coupled between the node and a ground;
a first control circuit coupled to the pull-up devices, wherein the first control circuit has a first input coupled to the first output of the delay circuit, a second input coupled to the second output of the delay circuit, and a control input configured to receive a first delay code; and
a second control circuit coupled to the pull-down devices, wherein the second control circuit has a first input coupled to the first output of the delay circuit, a second input coupled to the second output of the delay circuit, and a control input configured to receive a second delay code.

25. The system of clause 24, wherein the delay circuit is configured to receive an input signal at the input of the delay circuit, delay the input signal by a tunable delay to provide a first signal at the first output of the delay circuit, and delay the input signal by the tunable delay and an additional delay to provide a second signal at the second output of the delay circuit.

26. The system of clause 25, wherein the delay circuit is configured to tune the tunable delay by a multiple of a delay step based on a delay control signal, and the additional delay is equal to the delay step.

27. The system of any one of clauses 25 or 26, wherein the first control circuit is configured to input the first signal to a programmable number of the pull-up devices based on the first delay code, and input the second signal to remaining ones of the pull-up devices.

28. The system of any one of clauses 25 to 27, wherein the second control circuit is configured to input the first signal to a programmable number of the pull-down devices based on the second delay code, and input the second signal to remaining ones of the pull-down devices.

29. The system of any one of clauses 24 to 28, wherein the delay interpolator further comprises an output buffer having an input coupled to the node, and an output.

30. The system of clause 29, wherein the output buffer has a rising edge threshold and a falling edge threshold, and the output buffer is configured to transition the output of the output buffer from a first logic state to a second logic state when a rising edge at the input of the output buffer crosses the rising edge threshold, and transition the output of the output buffer from the second logic state to the first logic state when a falling edge at the input of the output buffer crosses the falling edge threshold.

31. The system of clause 29 or 30, further comprising a latch having a data input, a clock input coupled to the output of the output buffer, and an output.

32. The system of any one of clauses 24 to 31, wherein the first delay code and the second delay code are different.

33. The system of any one of clauses 24 to 31, wherein the first delay code and the second delay code are the same.

34. The system of clause 25, wherein:
the first delay code comprises multiple bits;
the first control circuit comprises a first plurality of control devices; and
each of the first plurality of control devices has a respective first input coupled to the first input of the first control circuit, a respective second input coupled to the second input of the first control circuit, a respective control input configured to receive a respective one of the bits of the first delay code, and a respective output coupled to a respective one of the pull-up devices.

35. The system of clause 34, wherein each of the first plurality of control devices is configured to input the first signal or the second signal to the respective one of the pull-up devices based on a logic value of the respective one of the bits of the first delay code.

36. The system clause 34 or 35, wherein:
the second delay code comprises multiple bits;
the second control circuit comprises a second plurality of control devices; and
each of the second plurality of control devices has a respective first input coupled to the first input of the second control circuit, a respective second input coupled to the second input of the second control circuit, a respective control input configured to receive a respective one of the bits of the second delay code, and a respective output coupled to a respective one of the pull-down devices.

37. The system of clause 36, wherein:
each of the first plurality of control devices is configured to input the first signal or the second signal to the respective one of the pull-up devices based on a logic value of the respective one of the bits of the first delay code; and
each of the second plurality of control devices is configured to input the first signal or the second signal to the respective one of the pull-down devices based on a logic value of the respective one of the bits of the second delay code.

38. The delay interpolator of clause 1, wherein the first signal and the second signal are received from a delay circuit, and the second signal is delayed with respect to the first signal by a delay step of the delay circuit.

39. The delay interpolator of clause 1 or 38, wherein the first signal and the second signal are received from a delay circuit, and the delay circuit is configured to provide the second signal by delaying the first signal by an additional delay device.

It is to be appreciated that the present disclosure is not limited to the exemplary terminology used above to describe aspects of the present disclosure. For example, a delay device may also be referred to as a delay stage, a delay buffer, a delay element, a delay unit, or another term. A control device may also be referred to as control logic, a control circuit, or another term. A delay circuit may also be referred to as a delay line, or another term.

The delay control circuit 650 may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A delay interpolator, comprising:
   pull-up devices, wherein each of the pull-up devices is coupled between a supply rail and a node;
   pull-down devices, wherein each of the pull-down devices is coupled between the node and a ground;
   a first control circuit coupled to the pull-up devices, wherein the first control circuit has a first input configured to receive a first signal, a second input configured to receive a second signal that is delayed with respect to the first signal, and a control input configured to receive a first delay code; and
   a second control circuit coupled to the pull-down devices, wherein the second control circuit has a first input configured to receive the first signal, a second input configured to receive the second signal, and a control input configured to receive a second delay code.

2. The delay interpolator of claim 1, wherein each of the pull-up devices comprises a respective transistor having a gate coupled to the first control circuit.

3. The delay interpolator of claim 2, wherein each of the pull-down devices comprises a respective transistor having a gate coupled to the second control circuit.

4. The delay interpolator of claim 1, wherein each of the pull-up devices comprises a respective p-type field effect transistor having a gate coupled to the first control circuit, a source coupled to the supply rail, and a drain coupled to the node.

5. The delay interpolator of claim 4, wherein each of the pull-down devices comprises a respective n-type field effect transistor having a gate coupled to the second control circuit, a drain coupled to the node, and a source coupled to the ground.

6. The delay interpolator of claim 1, wherein the first delay code and the second delay code are different.

7. The delay interpolator of claim 1, wherein the first delay code and the second delay code are the same.

8. The delay interpolator of claim 1, further comprising an output buffer having an input coupled to the node, and an output.

9. The delay interpolator of claim 8, wherein the output buffer has a rising edge threshold and a falling edge threshold, and the output buffer is configured to transition the output of the output buffer from a first logic state to a second logic state when a rising edge at the input of the output buffer crosses the rising edge threshold, and transition the output of the output buffer from the second logic state to the first logic state when a falling edge at the input of the output buffer crosses the falling edge threshold.

10. The delay interpolator of claim 8, further comprising a capacitor coupled between the node and the ground.

11. The delay interpolator of claim 1, wherein:
    the first delay code comprises multiple bits;
    the first control circuit comprises a first plurality of control devices; and
    each of the first plurality of control devices has a respective first input coupled to the first input of the first control circuit, a respective second input coupled to the second input of the first control circuit, a respective control input configured to receive a respective one of the bits of the first delay code, and a respective output coupled to a respective one of the pull-up devices.

12. The delay interpolator of claim 11, wherein each of the first plurality of control devices is configured to input the first signal or the second signal to the respective one of the pull-up devices based on a logic value of the respective one of the bits of the first delay code.

13. The delay interpolator of claim 11, wherein:
    the second delay code comprises multiple bits;
    the second control circuit comprises a second plurality of control devices; and
    each of the second plurality of control devices has a respective first input coupled to the first input of the second control circuit, a respective second input coupled to the second input of the second control circuit, a respective control input configured to receive a respective one of the bits of the second delay code, and a respective output coupled to a respective one of the pull-down devices.

14. The delay interpolator of claim 13, wherein:
    each of the first plurality of control devices is configured to input the first signal or the second signal to the respective one of the pull-up devices based on a logic value of the respective one of the bits of the first delay code; and
    each of the second plurality of control devices is configured to input the first signal or the second signal to the respective one of the pull-down devices based on a logic value of the respective one of the bits of the second delay code.

15. The delay interpolator of claim 1, wherein the first control circuit is configured to input the first signal to a programmable number of the pull-up devices based on the first delay code, and input the second signal to remaining ones of the pull-up devices.

16. The delay interpolator of claim 15, wherein the second control circuit is configured to input the first signal to a programmable number of the pull-down devices based on the second delay code, and input the second signal to remaining ones of the pull-down devices.

17. A method of operating a delay interpolator including pull-up devices coupled between a supply rail and a node, and pull-down devices coupled between the node and a ground, the method comprising:
    receiving an first signal;
    receiving a second signal that is delayed with respect to the first signal;
    inputting the first signal to a programmable number of the pull-up devices based on a first delay code;
    inputting the second signal to remaining ones of the pull-up devices;
    inputting the first signal to a programmable number of the pull-down devices based on a second delay code; and
    inputting the second signal to remaining ones of the pull-down devices.

18. The method of claim 17, wherein the first delay code and the second delay code are different.

19. The method of claim 17, wherein the first delay code and the second delay code are the same.

20. The method of claim 17, wherein:
    the first delay code comprises bits; and
    inputting the first signal to the programmable number of the pull-up devices based on the first delay code comprises:
        for each of the pull-up devices, inputting the first signal to the pull-up device if a respective one of the bits of the first delay code has a first logic value.

21. The method of claim 20, wherein inputting the second signal to the remaining ones of the pull-up devices comprises:
    for each of the pull-up devices, inputting the second signal to the pull-up device if the respective one of the bits of the first delay code has a second logic value.

22. The method of claim 17, wherein:
the second delay code comprises bits; and
inputting the first signal to the programmable number of the pull-down devices based on the second delay code comprises:
for each of the pull-down devices, inputting the first signal to the pull-down device if a respective one of the bits of the second delay code has a first logic value.

23. The method of claim 22, wherein inputting the second signal to the remaining ones of the pull-down devices comprises:
for each of the pull-down devices, inputting the second signal to the pull-down device if the respective one of the bits of the second delay code has a second logic value.

24. A system, comprising:
a delay circuit having an input, a first output, and a second output; and
a delay interpolator, comprising:
pull-up devices, wherein each of the pull-up devices is coupled between a supply rail and a node;
pull-down devices, wherein each of the pull-down devices is coupled between the node and a ground;
a first control circuit coupled to the pull-up devices, wherein the first control circuit has a first input coupled to the first output of the delay circuit, a second input coupled to the second output of the delay circuit, and a control input configured to receive a first delay code; and
a second control circuit coupled to the pull-down devices, wherein the second control circuit has a first input coupled to the first output of the delay circuit, a second input coupled to the second output of the delay circuit, and a control input configured to receive a second delay code.

25. The system of claim 24, wherein the delay circuit is configured to receive an input signal at the input of the delay circuit, delay the input signal by a tunable delay to provide a first signal at the first output of the delay circuit, and delay the input signal by the tunable delay and an additional delay to provide a second signal at the second output of the delay circuit.

26. The system of claim 25, wherein the delay circuit is configured to tune the tunable delay by a multiple of a delay step based on a delay control signal, and the additional delay is equal to the delay step.

27. The system of claim 25, wherein the first control circuit is configured to input the first signal to a programmable number of the pull-up devices based on the first delay code, and input the second signal to remaining ones of the pull-up devices.

28. The system of claim 27, wherein the second control circuit is configured to input the first signal to a programmable number of the pull-down devices based on the second delay code, and input the second signal to remaining ones of the pull-down devices.

29. The system of claim 24, wherein the delay interpolator further comprises an output buffer having an input coupled to the node, and an output.

30. The system of claim 29, wherein the output buffer has a rising edge threshold and a falling edge threshold, and the output buffer is configured to transition the output of the output buffer from a first logic state to a second logic state when a rising edge at the input of the output buffer crosses the rising edge threshold, and transition the output of the output buffer from the second logic state to the first logic state when a falling edge at the input of the output buffer crosses the falling edge threshold.

31. The system of claim 29, further comprising a latch having a data input, a clock input coupled to the output of the output buffer, and an output.

\* \* \* \* \*